United States Patent
Shiokawa et al.

(10) Patent No.: US 10,978,315 B2
(45) Date of Patent: Apr. 13, 2021

(54) VACUUM EVACUATION SYSTEM

(71) Applicant: EBARA CORPORATION, Tokyo (JP)

(72) Inventors: Atsushi Shiokawa, Tokyo (JP); Tetsuro Sugiura, Tokyo (JP); Shinichi Sekiguchi, Tokyo (JP); Takashi Kyotani, Tokyo (JP); Tetsuo Komai, Tokyo (JP); Norio Kimura, Tokyo (JP); Keiichi Ishikawa, Tokyo (JP); Toru Osuga, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 709 days.

(21) Appl. No.: 15/313,990

(22) PCT Filed: May 28, 2015

(86) PCT No.: PCT/JP2015/065387
§ 371 (c)(1),
(2) Date: Nov. 25, 2016

(87) PCT Pub. No.: WO2015/182699
PCT Pub. Date: Dec. 3, 2015

(65) Prior Publication Data
US 2017/0200622 A1    Jul. 13, 2017

(30) Foreign Application Priority Data

May 30, 2014 (JP) .............................. JP2014-112480
Mar. 25, 2015 (JP) .............................. JP2015-063238

(51) Int. Cl.
*C23C 16/44* (2006.01)
*H01L 21/67* (2006.01)
(Continued)

(52) U.S. Cl.
CPC ........ *H01L 21/67017* (2013.01); *C23C 14/22* (2013.01); *C23C 16/4412* (2013.01);
(Continued)

(58) Field of Classification Search
CPC ......... H01L 21/67017; H01L 21/67276; H01L 21/3065; H01L 21/205; H01L 21/31;
(Continued)

(56) References Cited

U.S. PATENT DOCUMENTS 6,045,332 A    4/2000  Lee et al.
2005/0254981 A1*  11/2005  Liepert ................. F04C 23/001
418/5

(Continued)

FOREIGN PATENT DOCUMENTS

CN    101922437    * 12/2010    .............. F04B 37/14
JP     3-279694 A    12/1991
(Continued)

OTHER PUBLICATIONS

International Search Report dated Aug. 25, 2015 in PCT/JP2015/065387 (4 pages).

*Primary Examiner* — Rudy Zervigon
(74) *Attorney, Agent, or Firm* — Rothwell, Figg, Ernst & Manbeck, P.C.

(57) ABSTRACT

The present invention relates to a vacuum evacuation system used to evacuate a processing gas from one or more process chambers for use in, for example, a semiconductor-device manufacturing apparatus. The vacuum evacuation system is a vacuum apparatus for evacuating a gas from a plurality of process chambers (1). The vacuum evacuation system includes a plurality of first vacuum pumps (5) coupled to the plurality of process chambers (1) respectively, a collecting pipe (7) coupled to the plurality of first vacuum pumps (5), and a second vacuum pump (8) coupled to the collecting pipe (7).

9 Claims, 22 Drawing Sheets

(51) Int. Cl.
*F04B 37/16* (2006.01)
*H01L 21/205* (2006.01)
*H01L 21/3065* (2006.01)
*H01L 21/31* (2006.01)
*C23C 16/52* (2006.01)
*F04B 37/14* (2006.01)
*H01J 37/32* (2006.01)
*F04B 41/00* (2006.01)
*C23C 14/22* (2006.01)
*G05D 16/20* (2006.01)

(52) U.S. Cl.
CPC .............. *C23C 16/52* (2013.01); *F04B 37/14* (2013.01); *F04B 37/16* (2013.01); *F04B 41/00* (2013.01); *G05D 16/2013* (2013.01); *H01J 37/32834* (2013.01); *H01J 37/32844* (2013.01); *H01L 21/205* (2013.01); *H01L 21/3065* (2013.01); *H01L 21/31* (2013.01); *H01L 21/67276* (2013.01); *Y02C 20/30* (2013.01); *Y02P 70/50* (2015.11)

(58) Field of Classification Search
CPC ..... C23C 16/4412; C23C 16/52; C23C 14/22; F04B 41/00; F04B 37/14; F04B 37/16; G05D 16/2013; H01J 37/32844; H01J 37/32834; Y02C 20/30

USPC ...................................... 118/715; 156/345.29
See application file for complete search history.

(56) References Cited

U.S. PATENT DOCUMENTS

2015/0345645 A1\* 12/2015 Kutney .................... F16K 1/523
                                                          454/49
2017/0350395 A1\* 12/2017 Schofield ................ F04C 25/02

FOREIGN PATENT DOCUMENTS

| JP | 10-57798 A    | 3/1998  |
| JP | 10-63301 A    | 3/1998  |
| JP | 10-137545 A   | 5/1998  |
| JP | 2001-298018 A | 10/2001 |
| JP | 2004-218648 A | 8/2004  |
| JP | 2005-180279 A | 7/2005  |
| JP | 2005-232977 A | 9/2005  |
| JP | 4180265 B2    | 11/2008 |
| JP | 2009-164213 A | 7/2009  |
| JP | 2009-534574 A | 9/2009  |
| JP | 2012033522 A  | 2/2012  |
| TW | 428067 B      | 4/2001  |
| WO | 2012086767 A1 | 6/2012  |

\* cited by examiner

VACUUM EVACUATION SYSTEM

CROSS REFERENCE TO RELATED APPLICATION

This application is a 35 U.S.C. 371 National Phase Entry Application from PCT/JP2015/065387, filed May 28, 2015, which claims priority to Japanese Patent Application Nos. 2014-112480, filed May 30, 2014, and 2015-063238, filed Mar. 25, 2015, the disclosures of which are incorporated herein in their entirety by reference.

TECHNICAL FIELD

The present invention relates to a vacuum evacuation system used to evacuate a processing gas from one or more process chambers for use in, for example, a semiconductor-device manufacturing apparatus.

BACKGROUND ART

As shown in a patent document 1, a typical semiconductor-device manufacturing apparatus includes a plurality of process chambers each for processing a wafer. In these process chambers, a process, such as a chemical vapor deposition (CVD) process, an etching process, or the like, is performed on a plurality of wafers. A processing gas, such as a raw material gas, an etching gas or the like, is used for processing the wafers, and the processing gas is evacuated from the process chambers by a vacuum evacuation system.

As shown in the above-mentioned patent document 1, a conventional vacuum evacuation system has a structure in which a plurality of vacuum pump units are coupled to the plurality of process chambers, respectively. These days, the number of process chambers tends to increase in order to process more wafers. Such a tendency entails an increase in the number of vacuum pumps used in the vacuum evacuation system, thus resulting in an increase in an installation space and a cost of the vacuum evacuation system.

Generally, a spare pump (which will be hereinafter referred to as a backup pump) is provided for backup of the vacuum pump that is coupled to the semiconductor-device manufacturing apparatus. The purpose of using this backup pump is to evacuate the process chamber during maintenance of the vacuum pump, and to evacuate the process chamber during malfunction of the vacuum pump.

The vacuum pump has a function to emit a speed drop signal when a rotational speed of the vacuum pump is lowered to a preset speed lower limit. This speed drop signal indicates an extraordinary decrease in the rotational speed. The extraordinary decrease in the rotational speed may be caused by a solidification of the processing gas that has been sucked from the process chamber. The solidified processing gas forms depositions in the vacuum pump, and such depositions prevent a rotation of a pump rotor. When such an extraordinary decrease in the rotational speed occurs, a pressure in the process chamber increases, and the semiconductor-device manufacturing apparatus detects an extraordinary pressure, thus stopping its operation.

Thus, in order to evacuate the process chamber during malfunction of the vacuum pump, the above-described backup pump is provided. When the above-described speed drop signal is sent from the vacuum pump to a controller, the controller couples the backup pump to the process chamber, so that the backup pump can evacuate the processing gas from the process chamber.

However, as shown in FIG. 22, when the above-described speed drop signal is emitted from the vacuum pump, the rotational speed of the vacuum pump has already been decreased significantly. As a result, the pressure in the process chamber may exceed an upper limit of a threshold value for a processable pressure, causing the semiconductor-device manufacturing apparatus to stop its operation.

CITATION LIST

Patent Literature

Patent document 1: Japanese Laid-open Patent Publication No. 2005-232977
Patent document 2: Japanese Laid-open Patent Publication No. 2009-164213
Patent document 3: Japanese Patent No. 4180265

SUMMARY OF INVENTION

Technical Problem

It is an object of the present invention to provide a vacuum evacuation system capable of reducing an installation space and a cost thereof. Further, it is an object of the present invention to provide a vacuum evacuation system capable of switching a vacuum evacuation operation from a vacuum pump to a backup pump before a rotational speed of the vacuum pump is lowered significantly.

Solution to Problem

According to one aspect of the present invention, there is provided a vacuum evacuation system for evacuating a gas from a plurality of process chambers, comprising: a plurality of first vacuum pumps which can be coupled to the plurality of process chambers, respectively; a collecting pipe coupled to the plurality of first vacuum pumps; and a second vacuum pump coupled to the collecting pipe.

In a preferred aspect of the present invention, the second vacuum pump is disposed near the plurality of first vacuum pumps.

In a preferred aspect of the present invention, the collecting pipe comprises a plurality of collecting pipes, and the second vacuum pump comprises a plurality of second vacuum pumps, all of the plurality of collecting pipes are coupled to the plurality of first vacuum pumps, and the plurality of second vacuum pumps are coupled to the plurality of collecting pipes, respectively.

In a preferred aspect of the present invention, the vacuum evacuation system further comprises a third vacuum pump coupled to the plurality of second vacuum pumps, wherein the plurality of second vacuum pumps comprise multi-stage positive-displacement vacuum pumps.

In a preferred aspect of the present invention, the vacuum evacuation system further comprises a second collecting pipe through which the plurality of second vacuum pumps are coupled to the third vacuum pump, wherein the plurality of collecting pipes comprise a plurality of first collecting pipes.

In a preferred aspect of the present invention, the third vacuum pump comprises a plurality of third vacuum pumps which are arranged in parallel.

In a preferred aspect of the present invention, the second collecting pipe has a plurality of branch pipes coupled to the plurality of third vacuum pumps, respectively, and a plurality of on-off valves are attached to the plurality of branch pipes, respectively.

In a preferred aspect of the present invention, the collecting pipe comprises a first collecting pipe, the vacuum evacuation system includes a plurality of evacuation units and a third vacuum pump which is disposed downstream of the second vacuum pump, the plurality of first vacuum pumps, the second vacuum pump, and the first collecting pipe constitute one of the plurality of evacuation units, and the vacuum evacuation system further comprises a second collecting pipe through which the plurality of second vacuum pumps, included in the plurality of evacuation units, are coupled to the third vacuum pump.

In a preferred aspect of the present invention, the third vacuum pump comprises a plurality of third vacuum pumps, and the number of third vacuum pumps is smaller than the number of second vacuum pumps.

In a preferred aspect of the present invention, the second collecting pipe comprises a plurality of second collecting pipes arranged in parallel, the third vacuum pump comprises a plurality of third vacuum pumps, and the plurality of third vacuum pumps are coupled to the plurality of second vacuum pumps through the plurality of second collecting pipes.

In a preferred aspect of the present invention, each of the plurality of second collecting pipes includes: a plurality of exhaust pipes coupled to the plurality of second vacuum pumps respectively; a communication pipe to which the plurality of exhaust pipes are coupled; and a main pipe coupled to the communication pipe. A plurality of on-off valves are attached to the plurality of exhaust pipes, respectively, a plurality of shutoff valves are attached to the communication pipe, and each of the plurality of shutoff valves is located between adjacent two of the plurality of evacuation units.

In a preferred aspect of the present invention, the second vacuum pump comprises a plurality of second vacuum pumps arranged in parallel, and the plurality of second vacuum pumps are coupled to the collecting pipe.

In a preferred aspect of the present invention, the collecting pipe includes a plurality of branch pipes coupled to the plurality of second vacuum pumps, respectively, and a plurality of on-off valves are attached to the plurality of branch pipes, respectively.

In a preferred aspect of the present invention, the vacuum evacuation system further comprises: a cleaning-gas exhaust pipe coupled to the plurality of first vacuum pumps; and a cleaning-gas exhaust pump coupled to the cleaning-gas exhaust pipe, the cleaning-gas exhaust pipe and the collecting pipe being arranged in parallel.

In a preferred aspect of the present invention, the vacuum evacuation system further comprises a gas treatment device configured to treat a cleaning gas.

In a preferred aspect of the present invention, the vacuum evacuation system further comprises: an atmospheric-air exhaust pipe coupled to the plurality of process chambers, the atmospheric-air exhaust pipe and the collecting pipe being arranged in parallel; and a roughing pump coupled to the atmospheric-air exhaust pipe, the roughing pump being configured to be able to operate under atmospheric pressure.

In a preferred aspect of the present invention, an abatement unit is attached to the collecting pipe.

In a preferred aspect of the present invention, the vacuum evacuation system further comprises a gas treatment device for rendering a gas, which is exhausted from the plurality of process chambers, harmless.

According to another aspect of the present invention, there is provided a vacuum evacuation system comprising: a suction pipe; a branch pipe and a backup pipe branching off from the suction pipe; an on-off valve and a backup valve attached to the branch pipe and the backup pipe, respectively; a vacuum pump coupled to the branch pipe; a backup pump coupled to the backup pipe; and an operation controller configured to control opening and closing operations of the on-off valve and the backup valve, wherein the operation controller is configured to compare a rotational speed of the vacuum pump with a threshold value, and open the backup valve and close the on-off valve when the rotational speed of the vacuum pump is lower than the threshold value, and the suction-side pressure when the rotational speed of the vacuum pump is equal to the threshold value is lower than an pressure upper limit which indicates an extraordinary increase in the suction-side pressure.

In a preferred aspect of the present invention, the vacuum pump is configured to transmit a speed drop signal to the operation controller when the rotational speed of the vacuum pump has reached a preset speed lower limit, and the threshold value is larger than the speed lower limit.

In a preferred aspect of the present invention, the backup pump is operable at a first rotational speed when the rotational speed of the vacuum pump is equal to or more than the threshold value, and the backup pump is operable at a second rotational speed when the rotational speed of the vacuum pump is lower than the threshold value, the second rotational speed being higher than the first rotational speed.

In a preferred aspect of the present invention, the operation controller compares the rotational speed of the vacuum pump with the threshold value again after the backup valve is opened and before the on-off valve is closed, and then closes the on-off valve if the rotational speed of the vacuum pump is lower than the threshold value.

According to another aspect of the present invention, there is provided a vacuum evacuation system comprising: a suction pipe; a branch pipe and a backup pipe branching off from the suction pipe; an on-off valve and a backup valve attached to the branch pipe and the backup pipe, respectively; a vacuum pump coupled to the branch pipe; a backup pump coupled to the backup pipe; and an operation controller configured to control opening and closing operations of the on-off valve and the backup valve, wherein the operation controller is configured to open the backup valve and close the on-off valve when a suction-side pressure of the vacuum pump has reached a threshold value, the threshold value being lower than an pressure upper limit which indicates an extraordinary increase in the suction-side pressure.

Advantageous Effects of Invention

The number of second vacuum pump is smaller than the number of first vacuum pumps, because the second vacuum pump is coupled to the plurality of first vacuum pumps through the collecting pipe. Therefore, an installation space of the entirety of the vacuum evacuation system can be small. Moreover, an installation cost can be reduced.

When the vacuum evacuation operation is switched from the vacuum pump to the backup pump, the suction-side pressure (e.g., the pressure in the process chamber coupled to the suction pipe) is lower than the pressure upper limit which indicates an extraordinary increase in the suction-side pressure. Therefore, the backup pump can continue the vacuum evacuating operation, while preventing the extraordinary increase in the suction-side pressure.

DESCRIPTION OF EMBODIMENTS

Embodiments of the present invention will be described below with reference to the drawings.

Figure 1:
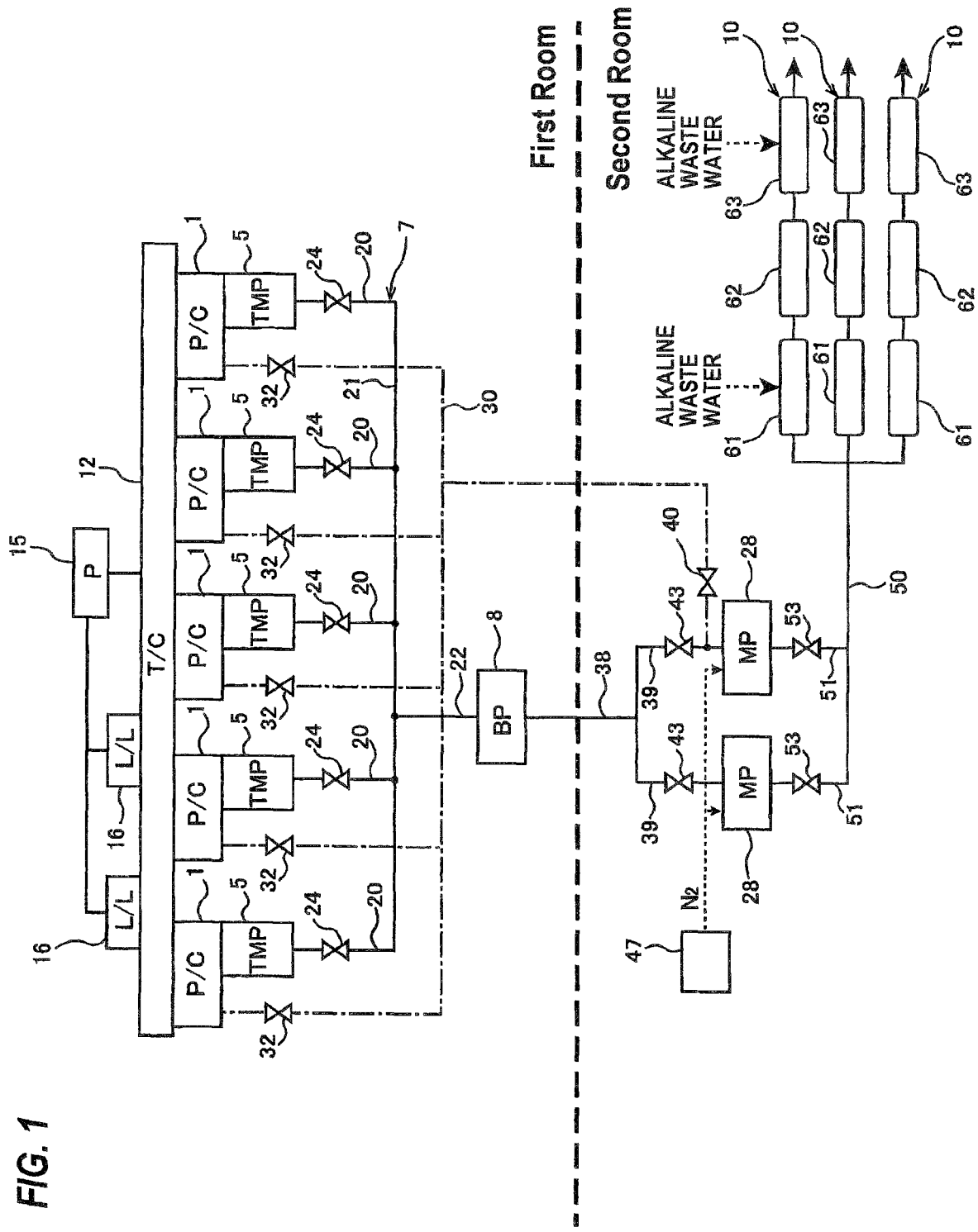
FIG. 1 is a view showing a vacuum evacuation system according to an embodiment of the present invention.

FIG. 1 is a view showing a vacuum evacuation system according to an embodiment of the present invention. This vacuum evacuation system is used to evacuate a processing gas from a plurality of process chambers used in a semiconductor-device manufacturing apparatus, such as a CVD apparatus, or an etching apparatus.

As shown in FIG. 1, the vacuum evacuation system includes a plurality of first vacuum pumps 5 which are coupled to a plurality of process chambers 1, respectively, a first collecting pipe 7 coupled to the plurality of first vacuum pumps 5, a second vacuum pump 8 coupled to the first collecting pipe 7, and gas treatment devices 10 for making a gas, which has been exhausted from the plurality of process chambers 1, harmless. In this embodiment, high-vacuum pumps, such as turbo-molecular pumps, are used as the first vacuum pumps 5.

The process chambers 1 are coupled to a transfer chamber 12. A roughing pump 15 is coupled to this transfer chamber 12 to constantly form a vacuum in the transfer chamber 12. Load-lock chambers 16 are coupled to the transfer chamber 12, and the roughing pump 15 is coupled to these load-lock chambers 16. Each of the load-lock chambers 16 is a gate allowing a wafer to be transferred between a vacuum space in the transfer chamber 12 and an atmospheric-pressure region, while maintaining the vacuum formed in the transfer chamber 12. A transfer robot, which is not shown, is disposed in the transfer chamber 12, so that a wafer is transported to any one of the process chambers 1 by the transfer robot.

A processing gas, such as an etching gas, is supplied into each process chamber 1 so that the wafer is processed in the process chamber 1. The process chamber 1 shown in FIG. 1 is a so-called single-type process chamber in which a single wafer is processed. The plurality of (five in FIG. 1) first vacuum pumps 5 are arranged adjacent to the plurality of (five in FIG. 1) process chambers 1, respectively, and are coupled to these process chambers 1, respectively. A vacuum in each process chamber 1 is formed by the operation of each first vacuum pump 5. A plurality of first vacuum pumps 5 may be coupled to a single process chamber 1.

In this embodiment, the single second vacuum pump 8 is provided. The second vacuum pump 8 is coupled to the first collecting pipe 7. The second vacuum pump 8 is coupled to all of the plurality of first vacuum pumps 5 through the first collecting pipe 7. The first collecting pipe 7 includes a plurality of exhaust pipes 20 which are coupled to the plurality of first vacuum pumps 5 respectively, a single horizontal pipe (or a communication pipe) 21 to which these exhaust pipes 20 are coupled, and a single main pipe 22 coupled to the horizontal pipe 21. The main pipe 22 is coupled to a suction inlet of the second vacuum pump 8. On-off valves 24 are attached to the exhaust pipes 20 of the first collecting pipe 7, respectively. Since the second vacuum pump 8 is coupled to the first vacuum pumps 5 through the first collecting pipe 7, the number of second vacuum pump 8 is smaller than the number of first vacuum pumps 5.

The second vacuum pump 8 may be a positive-displacement vacuum pump (for example, a multi-stage or single-stage Root type vacuum pump, a multi-stage or single-stage claw type vacuum pump, a screw type vacuum pump, or a combination thereof). The second vacuum pump 8 is configured to maintain a back-pressure of the first vacuum pumps 5 at several tens of Pa, and compress the processing gas up to several thousands of Pa (for example, 1000 to 5000 Pa).

A plurality of (two in FIG. 1) third vacuum pumps 28 are arranged in parallel downstream of the second vacuum pump 8. These third vacuum pumps 28 are coupled to the second vacuum pump 8. The second vacuum pump 8 is coupled to a main pipe 38, and a plurality of branch pipes 39 are coupled to the main pipe 38. The plurality of third vacuum pumps 28 are coupled to the plurality of branch pipes 39, respectively. On-off valves 43 are attached to the branch pipes 39, respectively.

In this embodiment, the two third vacuum pumps 28 are provided. Both of these two third vacuum pumps 28 may be operated. Alternatively, only one of the two third vacuum pumps 28 may be operated, while the other may be used as a spare pump. In the case where the two third vacuum pumps 28 are simultaneously operated, both the on-off valves 43 are opened. In the case where only one of the two third vacuum pumps 28 is operated, only one of the on-off valves 43 is opened. When one of the third vacuum pumps 28 has broken down, the pump operation can be switched to the other third vacuum pump 28, because the two third vacuum pumps 28 are arranged in parallel. Accordingly, the vacuum evacuation system can continue its operation as a whole.

An inert-gas supply device 47 is coupled to the plurality of third vacuum pumps 28. This inert-gas supply device 47 is configured to supply an inert gas, such as nitrogen gas, into the third vacuum pumps 28 to thereby dilute the processing gas and prevent corrosion of the third vacuum pumps 28. A conventional vacuum evacuation system has the same number of vacuum pump units as the number of process chambers, and therefore it is necessary to supply a large amount of inert gas into these vacuum pump units. In contrast, the vacuum evacuation system shown in FIG. 1 includes fewer third vacuum pumps 28 than the process chambers 1. Therefore, a smaller amount of inert gas is injected into the processing gas, so that a load on an exhaust-gas treatment device 10, which will be described later, can be reduced.

Each of the third vacuum pumps 28 may be a positive-displacement vacuum pump (for example, a multi-stage or single-stage Root type vacuum pump, a multi-stage or single-stage claw type vacuum pump, a screw type vacuum pump, or a combination thereof). The third vacuum pump 28 is configured to maintain a back-pressure of the second vacuum pump 8 at several thousands of Pa (for example, 1000 to 5000 Pa), and compress the processing gas up to the atmospheric pressure. In this embodiment, the plurality of third vacuum pumps 28 are provided, while only a single third vacuum pump 28 may be provided.

The gas treatment device 10 is located downstream of the third vacuum pumps 28. The processing gas used in the process chamber 1 is a harmful gas, such as a raw material gas for use in the CVD process or an etching gas for use in the dry etching process. Such processing gas cannot be emitted as it is to the atmosphere. Accordingly, the gas treatment device 10 is provided for treating the processing gas to render the processing gas harmless. In this embodiment, three gas treatment devices 10 are arranged in parallel. The gas treatment devices 10 are coupled to the third vacuum pumps 28 through a collecting pipe 50. The collecting pipe 50 has two exhaust pipes 51 which are coupled to the two third vacuum pumps 28, respectively. On-off valves 53 are attached to these exhaust pipes 51, respectively.

Each gas treatment device 10 includes an upper wet-type abatement unit 61, a catalytic-type abatement unit 62, and a lower wet-type abatement unit 63. These three abatement units 61, 62, 63 are arranged, in series in this order. Alkaline wastewater, such as TMAH (tetramethylammonium hydroxide), is discharged from a semiconductor-device manufacturing apparatus. Generally, this alkaline wastewater is discarded. In this embodiment, this alkaline wastewater is utilized to treat the processing gas. The alkaline wastewater discharged from the semiconductor-device manufacturing apparatus is supplied into the upper wet-type abatement unit 61 and the lower wet-type abatement unit 63, and these wet-type abatement apparatuses 61, 63 utilize the alkaline wastewater to remove acid gas, such as hydrogen bromide, contained in the processing gas. By utilizing the alkaline wastewater in this manner, running costs of the wet-type abatement apparatuses 61, 63 can be reduced.

The wet-type abatement units 61, 63 have an advantage that a larger amount of gas, as compared with a dry-type abatement unit, can be treated, and thus the running costs are low. The upper wet-type abatement unit 61 mainly removes a gas for use in the etching process, such as hydrogen bromide (HBr), bromine ($Br_2$), or chlorine gas ($Cl_2$). The catalytic-type abatement unit 62 is provided for decomposing a harmful PFCs (perfluorinated compounds) gas contained in the processing gas. This catalytic-type abatement unit 62 has an advantage that the gas can be treated at a lower temperature, as compared with a combustion-type abatement unit and a plasma-heater-type abatement unit, and thus the running cost is low. However, in order to reduce the number of abatement units, the upper wet-type abatement unit 61, the catalytic-type abatement unit 62, and the lower wet-type abatement unit 63 may be of other processing type, such as a combustion-type abatement unit, a heater-type abatement unit, a plasma-type abatement unit, or the like.

When PFCs (perfluorinated compounds) gas is decomposed, an acid gas, such as HF (hydrogen fluoride), is generated. In order to remove such an acid gas, the lower wet-type abatement unit 63 is provided downstream of the catalytic-type abatement unit 62. As described above, this lower wet-type abatement unit 63 removes the acid gas using the alkaline wastewater that has been discharged from the semiconductor-device manufacturing apparatus. Water shower may be used as the lower wet-type abatement unit 63. The lower wet-type abatement unit 63 may be omitted so long as a concentration of the acid gas does not exceed a regulatory value of emission concentration.

In this embodiment, the three gas treatment devices 10 are provided in parallel. Therefore, based on a flow rate of the processing gas to be treated, all of the three gas treatment devices 10 may be operated, or one or two of those may be operated.

As described above, the fewer third vacuum pumps 28 are provided, compared with the conventional vacuum evacuation system. Accordingly, the amount of inert gas to be supplied into the third vacuum pumps 28 is also small. Therefore, an amount of processing gas to be treated in the gas treatment device 10 can be reduced, as compared with the conventional vacuum evacuation system. As a result, the gas treatment device 10 in its entirety can be made more compact.

In this embodiment, the first vacuum pump 5 directly coupled to the process chamber 1 is a high-vacuum pump, such as a turbo-molecular pump, the second vacuum pump 8 coupled to the first vacuum pump 5 is a booster pump which is a multi-stage positive-displacement vacuum pump, and the third vacuum pump 28 coupled to the second vacuum pump 8 is a main pump which is a multi-stage positive-displacement vacuum pump.

As shown in FIG. 1, the process chambers 1, the first vacuum pumps 5, and the second vacuum pump 8 are disposed in the same first room (for example, a clean room). The third vacuum pumps 28 and the gas treatment devices 10 are disposed in another room (a second room) separated from the first room. For example, the first room is located upstairs, and the second room is located downstairs. Since the first vacuum pumps 5 and the second vacuum pump 8 are installed in the same first room, the first collecting pipe 7, which couples the second vacuum pump 8 to the first vacuum pumps 5, can be short. The second vacuum pump 8 is located near the first vacuum pumps 5. A distance between the first vacuum pumps 5 and the second vacuum pump 8 may preferably be in a range of 1 m to 5 m, more preferably in a range of 1 m to 2 m.

In a conventional vacuum evacuation system, a first vacuum pump and a second vacuum pump are arranged on different floors, and a distance between the first vacuum pump and the second vacuum pump is about 10 m. In this embodiment, the distance between the first vacuum pumps 5 and the second vacuum pump 8 is about 2 m. As a result, a pipe conductance is increased, and a volumetric capacity required for the second vacuum pump 8 can be reduced. Therefore, the number of second vacuum pump 8 can be reduced.

As described above, the second vacuum pump 8 serves as the booster pump. Although a single-stage positive-displacement vacuum pump is typically used as the booster pump, a multi-stage positive-displacement vacuum pump is employed in this embodiment. The multi-stage positive-displacement pump has a wider operable pressure range than that of the single-stage vacuum pump. In other words, a back pressure required for the second vacuum pump 8 to be able to operate is higher than a back pressure required for the single-stage vacuum pump to be able to operate. Therefore, a more compact vacuum pump can be used as the third vacuum pump 28 that serves as the main pump coupled to the downstream side. Moreover, the number of third vacuum pumps 28 can be reduced.

An atmospheric-air exhaust pipe 30 is coupled to the plurality of process chambers 1. This atmospheric-air exhaust pipe 30 is coupled to the plurality of third vacuum pumps 28. A plurality of on-off valves 32 communicating with the process chambers 1 are attached to the atmospheric-air exhaust pipe 30. Further, an on-off valve 40, for establishing and shutting off a communication between the plurality of process chambers 1 and the third vacuum pump 28 coupled to the atmospheric-air exhaust pipe 30, is attached to the atmospheric-air exhaust pipe 30. During normal operation, these on-off valves 32, 40 are closed.

When the atmospheric air is to be evacuated from the process chamber 1, the on-off valves 32, 40 are opened. For example, after maintenance of a certain process chamber 1 of the plurality of process chambers 1 is terminated, it is necessary to evacuate that process chamber 1. However, if the atmospheric air is exhausted from the process chamber 1 by the first vacuum pump 5, the second vacuum pump 8, and the third vacuum pump 28, the atmospheric air may enter the other process chambers 1. Accordingly, only the on-off valve 32, communicating with that process chamber 1 filled with the atmospheric air, is opened, and further the on-off valve 40 is opened and one of the two on-off valves 43 is closed. Subsequently, the third vacuum pump 28, coupled to the atmospheric-air exhaust pipe 30, is started. The atmospheric air in the process chamber 1 is evacuated by the third vacuum pump 28 through the atmospheric-air exhaust pipe 30, while the other process chambers 1 can continue processing of wafers.

Figure 2:
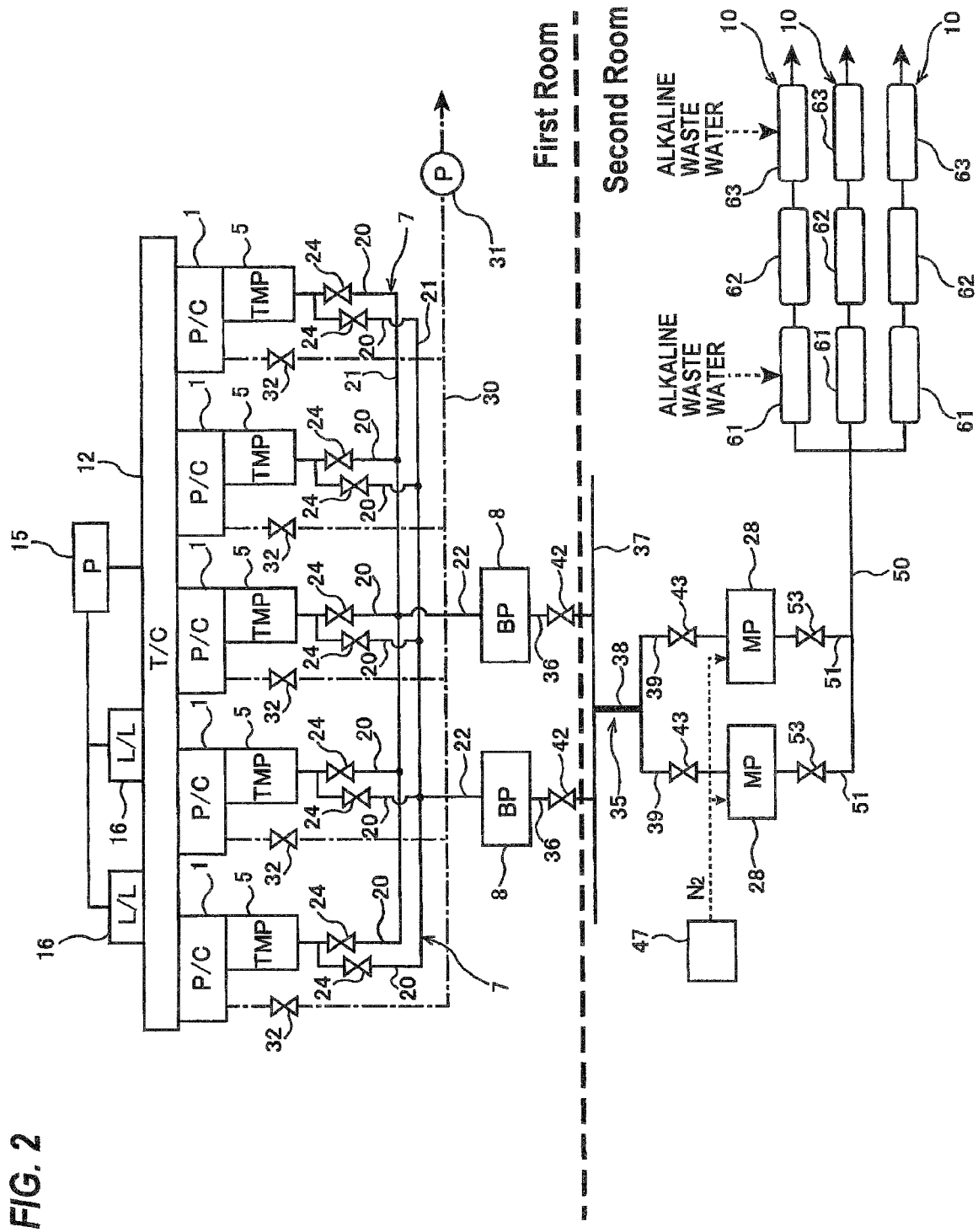
FIG. 2 is a view showing another embodiment of the vacuum evacuation system.

FIG. 2 is a view showing another embodiment of the vacuum evacuation system. In this embodiment, two second vacuum pumps 8 are provided. These second vacuum pumps 28 are arranged in parallel, and are coupled to two first collecting pipes 7, respectively. Each of the second vacuum pumps 8 is coupled to all of the plurality of first vacuum pumps 5 through the first collecting pipe 7. Each of the first collecting pipes 7 includes the plurality of exhaust pipes 20 which are coupled to the plurality of first vacuum pumps 5, respectively, the single horizontal pipe (communication pipe) 21 to which these exhaust pipes 2 are coupled, and the single main pipe 22 which is coupled to the horizontal pipe 21. The main pipe 22 is coupled to the suction inlet of the second vacuum pump 8. In this embodiment, the two second vacuum pumps 8 are arranged in parallel, and the two first collecting pipes 7, which are coupled to these two second vacuum pumps 8 respectively, are also arranged in parallel.

One of the two second vacuum pumps 8 serves as a spare pump, which is normally not operated. Therefore, the on-off valves 24, which communicate with the second vacuum pump 8 serving as the spare pump, are closed. In a case where the other second vacuum pump 8 has broken down, the on-off valves 24, communicating with this broken second vacuum pump 8, are closed, while the second vacuum pump 8 serving as the spare pump is started, and the on-off valves 24 communicating with that pump 8 are opened.

In this embodiment, the two second vacuum pumps 8 and the two first collecting pipes 7 are arranged in parallel. Thus, even if one of the second vacuum pumps 8 has broken down by any chance, the operation of the vacuum evacuation system in its entirety can be continued by switching to the other second vacuum pump 8. The number of second vacuum pumps 8 is less than the number of first vacuum pumps 5, because each second vacuum pump 8 is coupled to the first vacuum pumps 5 through each first collecting pipe 7.

The plurality of third vacuum pumps 28 are coupled to the plurality of second vacuum pumps 8 through a second collecting pipe 35. The second collecting pipe 35 includes a plurality of exhaust pipes 36 coupled to the plurality of second vacuum pumps 8, respectively, a single horizontal pipe (communication pipe) 37 to which these exhaust pipes 36 are coupled, a single main pipe 38 coupled to the horizontal pipe 37, and a plurality of branch pipes 39 coupled to the main pipe 38. The plurality of third vacuum pumps 28 are coupled to the plurality of branch pipes 39, respectively.

An atmospheric-air exhaust pipe 30 is coupled to the plurality of process chambers 1, and a roughing pump 31 is coupled to this atmospheric-air exhaust pipe 30. The roughing pump 31 is configured to be able to operate under the atmospheric pressure. A plurality of on-off valves 32, communicating with the process chambers 1, are attached to the atmospheric-air exhaust pipe 30. During normal operation, these on-off valves 32 are closed, and the roughing pump 31 is not in operation.

The roughing pump 31 is used to evacuate the atmospheric air from the process chamber 1. Specifically, only the on-off valve 32, which communicates with the process chamber 1 filled with the atmospheric air, is opened, and the roughing pump 31 is started. The atmospheric air in the process chamber 1 is expelled by the roughing pump 31 through the atmospheric-air exhaust pipe 30, while the other process chambers 1 can continue processing of wafers.

Figure 3:
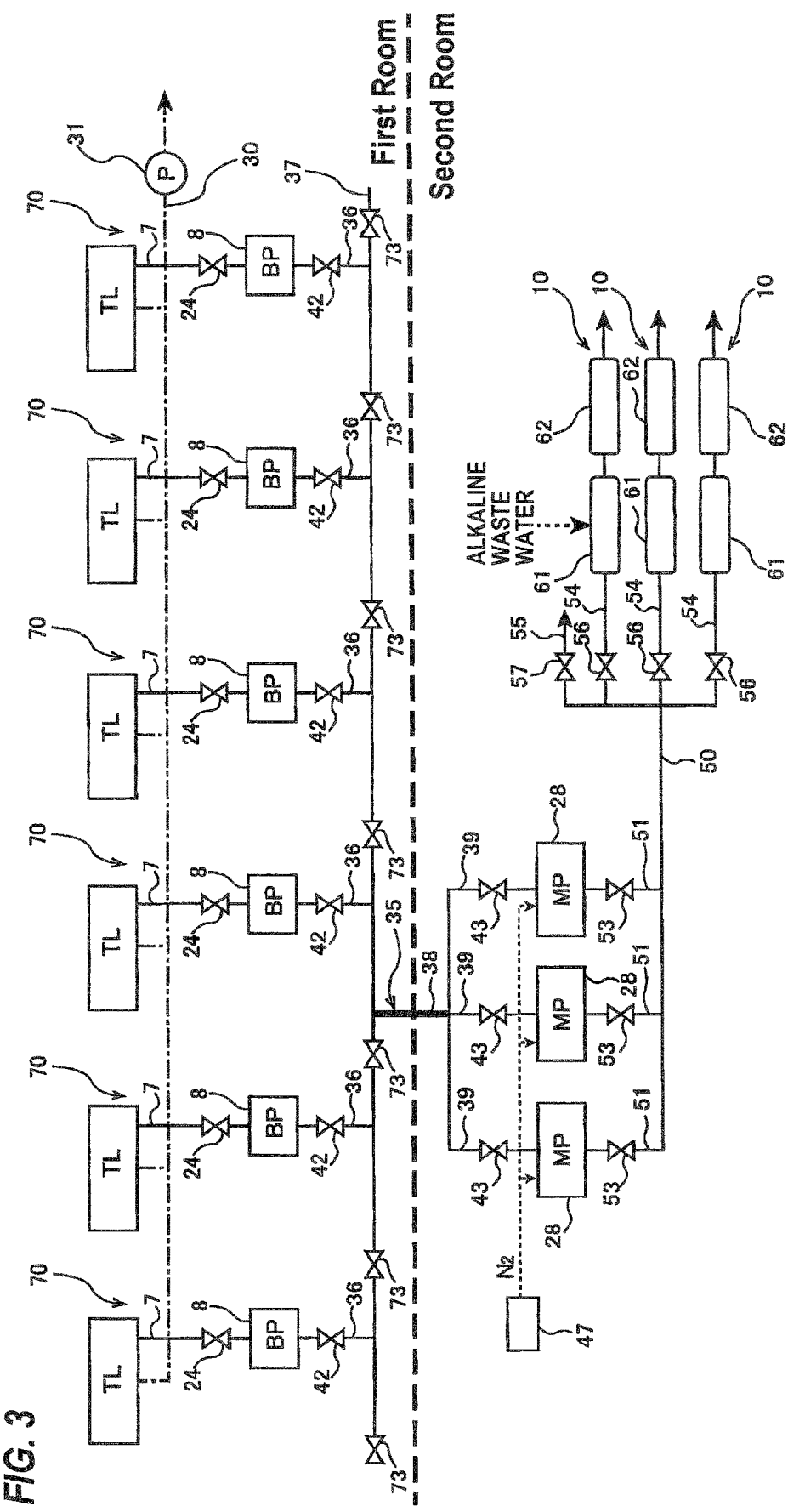
FIG. 3 is a view showing still another embodiment of the vacuum evacuation system.

FIG. 3 is a view showing still another embodiment of the vacuum evacuation system. Structures of this embodiment, which will not be described particularly, are identical to those of the embodiment shown in FIG. 1, and their repetitive descriptions are omitted. Symbol TL shown in FIG. 3 schematically represents an assembly which includes the five process chambers 1, the five first vacuum pumps 5, the transfer chamber 12, the two load-lock chambers 16, and the roughing pump 15, which are shown in FIG. 1. In other words, each assembly TL shown in FIG. 3 includes the five process chambers 1, the five first vacuum pumps 5, the transfer chamber 12, the two load-lock chambers 16, and the roughing pump 15.

As shown in FIG. 3, a plurality of (six in FIG. 3) evacuation units 70 are arranged in parallel. Each evacuation unit 70 includes the five first vacuum pumps 5, the single second vacuum pump 8, the single first collecting pipe 7, and the on-off valve 24 attached to the first collecting pipe 7. The plurality of second vacuum pumps 8 included in the plurality of evacuation units 70 are coupled to a plurality of third vacuum pumps 28 through a second collecting pipe 35. In this embodiment, three third vacuum pumps 28 are arranged in parallel.

The second collecting pipe 35 includes a plurality of exhaust pipes 36 which are respectively coupled to all of the second vacuum pumps 8 included in the plurality of evacuation units 70, a single horizontal pipe (communication pipe) 37 to which these exhaust pipes 36 are coupled, a single main pipe 38 coupled to the horizontal pipe 37, and a plurality of (three in FIG. 3) branch pipes 39 coupled to the main pipe 38. The plurality of third vacuum pumps 28 are coupled to the plurality of branch pipes 39, respectively. On-off valve 42 is attached to each of the exhaust pipes 36. Similarly, on-off valve 43 is attached to each of the branch pipes 39. A plurality of shutoff valves 73 are attached to the horizontal pipe 37. Each shutoff valve 73 is located between adjacent two of the plurality of evacuation units 70.

In this embodiment, all of the three third vacuum pumps 28 are operated. When one of the three third vacuum pumps 28 has broken down or stopped for maintenance, the other two third vacuum pumps 28 continue to evacuate the processing gas. In this manner, since the plurality of third vacuum pumps 28 are arranged in parallel, the vacuum evacuation system can continue its operation as a whole during the pump failure or the pump maintenance.

In this embodiment, each gas treatment device 10 includes the wet-type abatement unit 61 and the catalytic-type abatement unit 62. The collecting pipe 50 that couples the gas treatment devices 10 to the third vacuum pumps 28 includes branch pipes 54 and a bypass exhaust line 55. The branch pipes 54 are coupled to the gas treatment devices 10, respectively. On-off valves 56 are attached to these branch pipes 54 respectively, and an on-off valve 57 is attached to the bypass exhaust line 55. The bypass exhaust line 55 is normally closed by the on-off valve 57.

Figure 4:
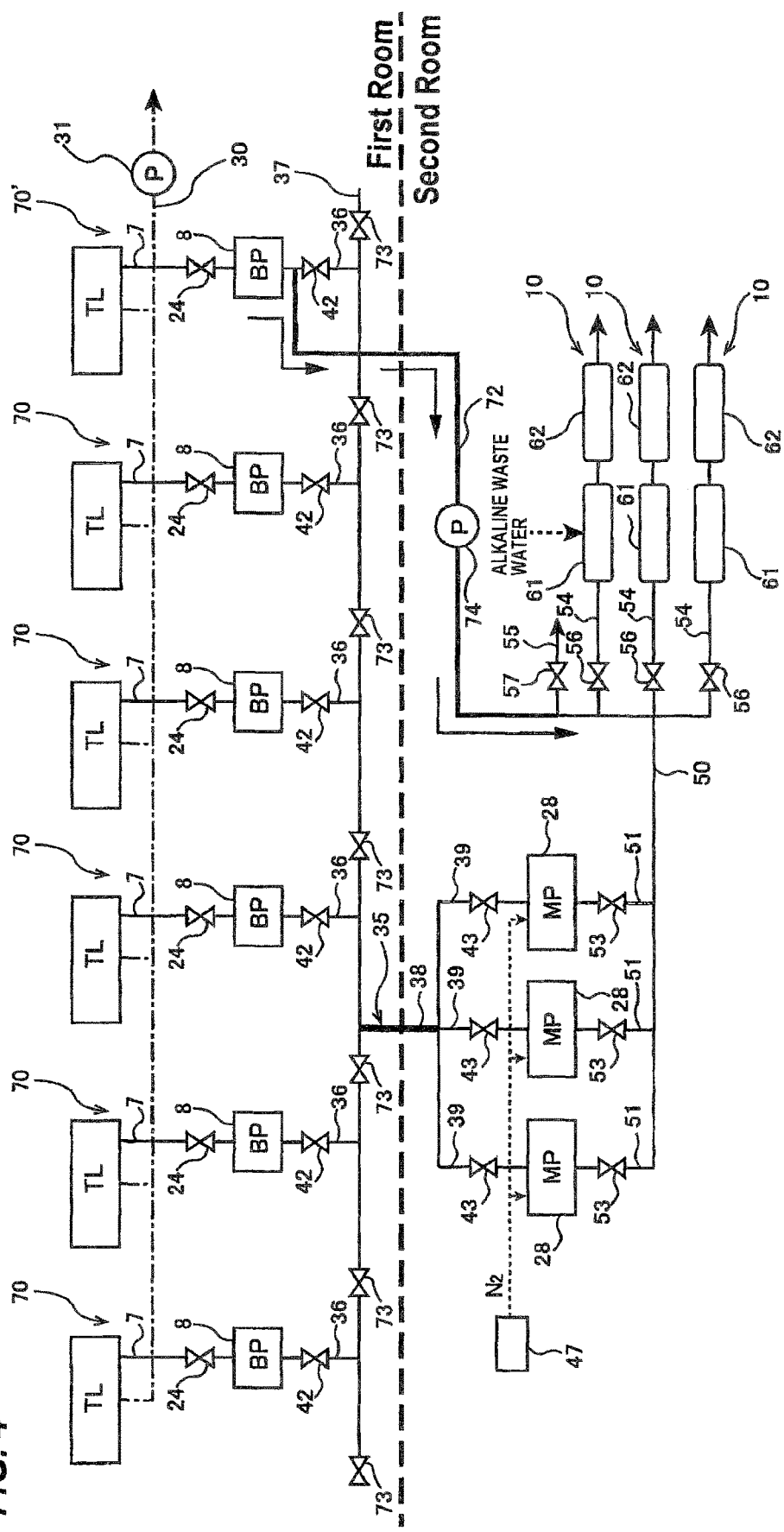
FIG. 4 is a view illustrating operations for starting up one of evacuation units.

FIG. 4 is a view illustrating operations for starting up one of the evacuation units 70. Hereinafter, this evacuation unit 70 will be referred to as evacuation unit 70'. An outlet of the second vacuum pump 8 of this evacuation unit 70' is coupled to the collecting pipe 50 through a start-up pipe 72. During the operation of starting up the evacuation unit 70', the on-off valve 42 communicating with the evacuation unit 70' is closed. The on-off valve 57 attached to the bypass exhaust line 55 remains closed. The start-up pipe 72 is provided with a start-up pump 74. In the start-up operation, the processing gas is evacuated from the evacuation unit 70' by the start-up pump 74, and is delivered to the gas treatment devices 10 through the collecting pipe 50.

The start-up operation for the evacuation unit 70' is performed through an exhaust route which is independent from the evacuating operations of the other evacuation units 70. Therefore, the start-up operation of the evacuation unit 70' can be performed without affecting the evacuating operations of the other evacuation units 70.

After the start-up operation of the evacuation unit 70' is terminated, the start-up pipe 72 and the start-up pump 74 are removed. Next, the roughing pump 31 is started to evacuate the process chamber 1 (see FIG. 1) coupled to the evacuation unit 70'. Subsequently, the on-off valve 42, communicating with the evacuation unit 70', is opened. Such operations allow the evacuation unit 70' to be coupled to the other evacuation units 70, without causing the gas from the evacuation unit 70' to enter the other evacuation units 70.

Figure 5:
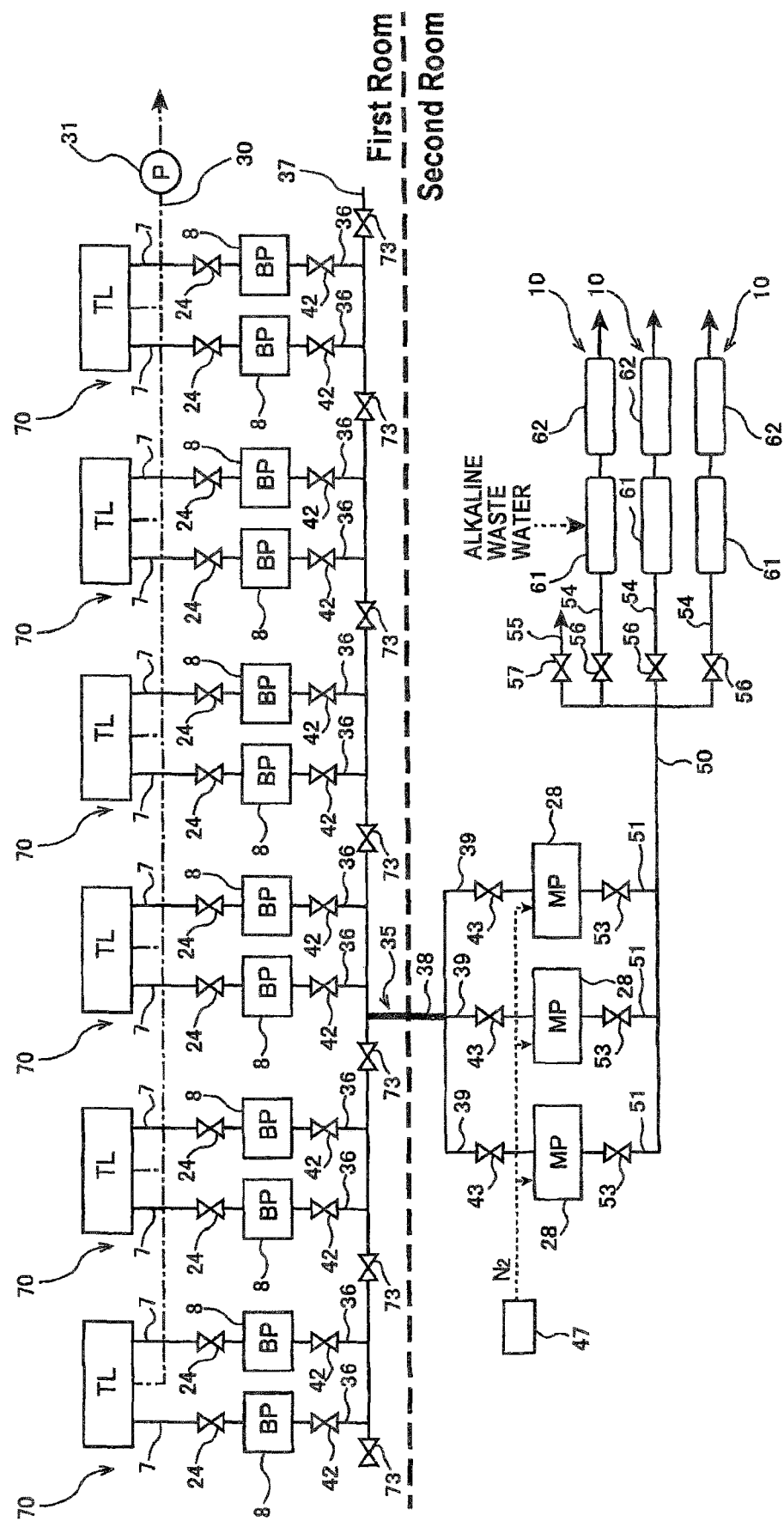
FIG. 5 is a view showing still another embodiment of the vacuum evacuation system.

FIG. 5 is a view showing another embodiment of the vacuum evacuation system. Structures of this embodiment, which will not be described particularly, are identical to those of the embodiment shown in FIG. 3, and their repetitive descriptions are omitted. As with the embodiment shown in FIG. 2, each of the evacuation units 70 includes two second vacuum pumps 8 arranged in parallel and two first collecting pipes 7 arranged in parallel. Specifically, each evacuation unit 70 includes the five first vacuum pumps 5, the two second vacuum pumps 8, the two first collecting pipes 7, and the on-off valves 24 attached to the first collecting pipes 7 respectively. The plurality of second vacuum pumps 8 included in the plurality of evacuation units 70 are coupled to a plurality of third vacuum pumps 28 through the second collecting pipe 35. In this embodiment, three third vacuum pumps 28 are arranged in parallel.

Figure 6:
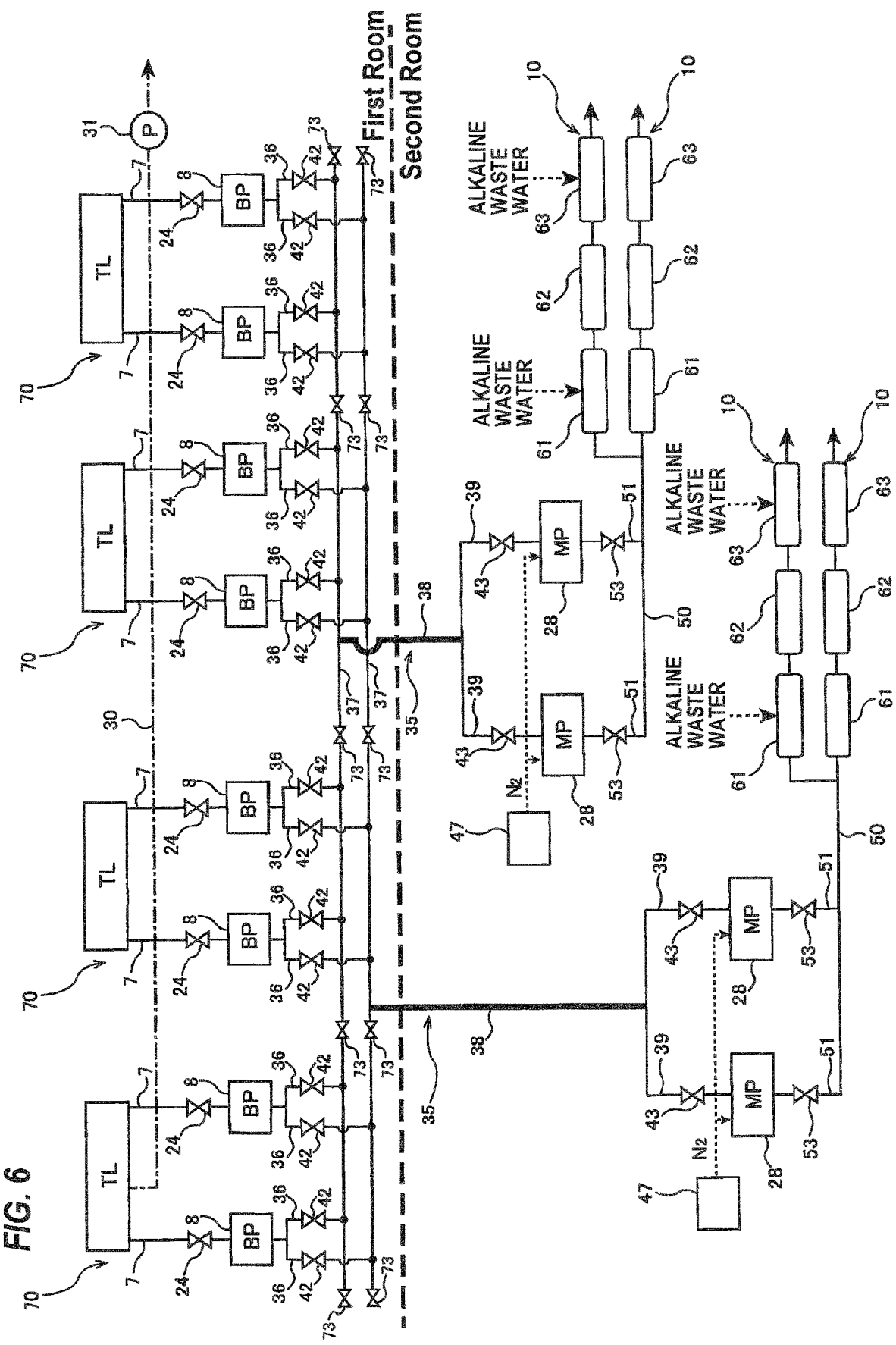
FIG. 6 is a view showing still another embodiment of the vacuum evacuation system.

FIG. 6 is a view showing still another embodiment of the vacuum evacuation system. Structures of this embodiment, which will not be described particularly, are identical to those of the embodiment shown in FIG. 5, and their repetitive descriptions are omitted. In this embodiment, two second collecting pipes 35 are arranged in parallel. Each of the two second collection pipes 35 is coupled to all of the second vacuum pumps 8 included in a plurality of (four in FIG. 6) evacuation units 70. Further, a plurality of (two in FIG. 6) third vacuum pumps 28 are coupled to each of the two collecting pipes 35. The exhaust-gas treatment devices 10 are coupled to the third vacuum pumps 28.

Each second collecting pipe 35 includes a plurality of exhaust pipes 36 which are coupled respectively to all of the second vacuum pumps 8 included in the plurality of evacuation units 70, a single horizontal pipe (communication pipe) 37 to which these exhaust pipes 36 are coupled, a single main pipe 38 coupled to the horizontal pipe 37, and a plurality of (two in FIG. 6) branch pipes 39 coupled to the main pipe 38. The plurality of third vacuum pumps 28 are coupled to the plurality of branch pipes 39, respectively. On-off valve 42 is attached to each of the exhaust pipes 36. Similarly, on-off valve 43 is attached to each of the branch pipes 39. A plurality of shutoff valves 73 are attached to the horizontal pipe 37. Each shutoff valve 73 is located between adjacent two of the plurality of evacuation units 70.

The embodiment shown in FIG. 6 includes two second collecting pipes 35 to which the on-off valves 42 and the shutoff valves 73 are attached, two sets of third vacuum pumps 28 coupled to these second collecting pipes respectively, and the gas treatment devices 10 which are coupled to the two sets of the third vacuum pumps 28 respectively. With such structures, when maintenance of a certain evacuation unit 70 of the plurality of evacuation units 70 is to be conducted, a communication between that evacuation unit 70 and the other evacuation units 70 can be shut off.

Figure 7:
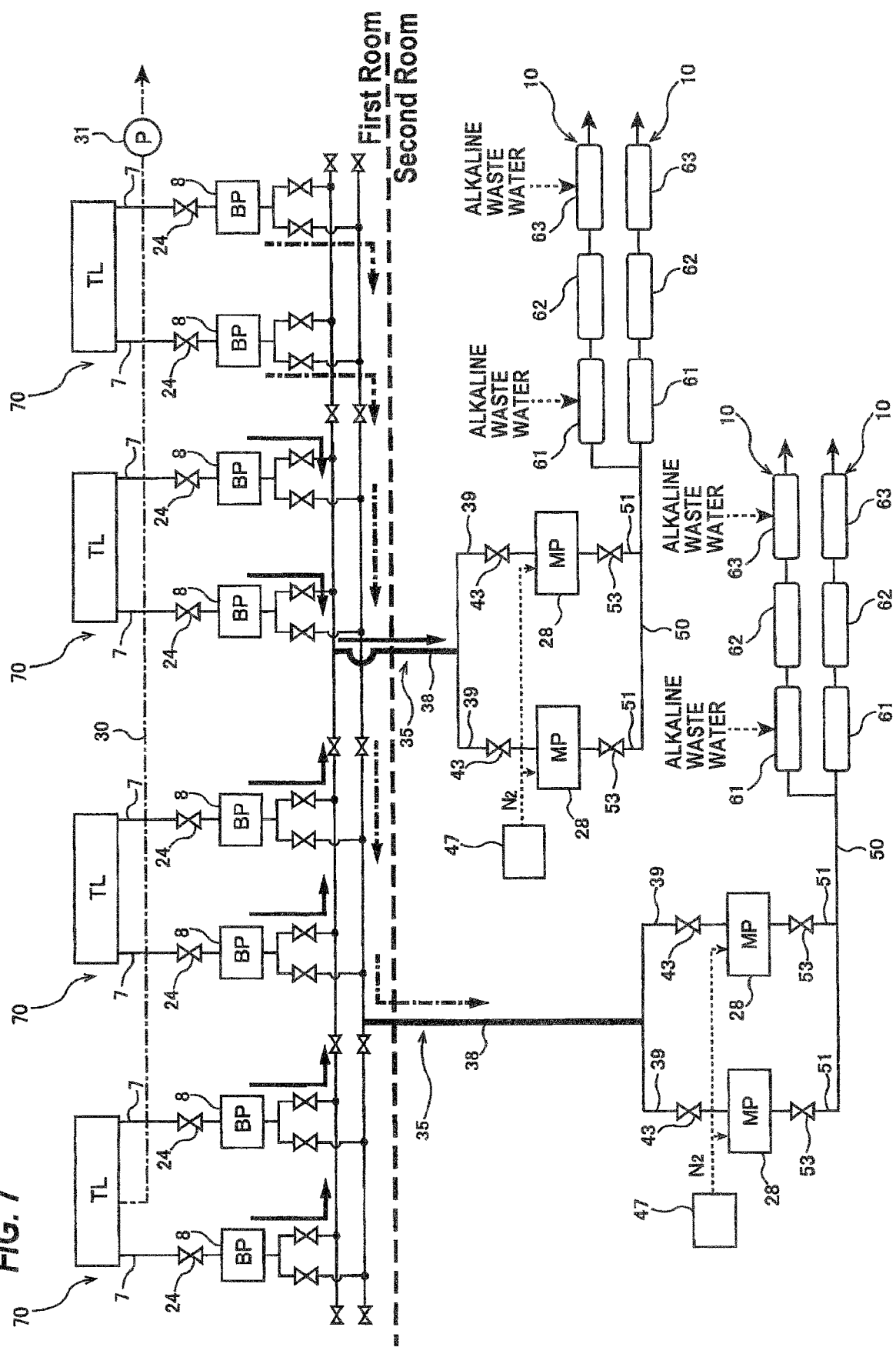
FIG. 7 is a view showing an example of operations of the vacuum evacuation system shown in FIG. 6.

Further, as shown in FIG. 7, only certain evacuation unit(s) 70 can communicate with one of the two second collecting pipes 35, while the other evacuation unit(s) 70 can communicate with the other second collecting pipe 35. In such a case, a pumping speed of the certain evacuation unit(s) 70 can be set to be higher than a pumping speed of the other evacuation unit(s) 70. Further, a type of processing gas evacuated by the certain evacuation unit(s) 70 may be different from a type of processing gas evacuated by the other evacuation unit(s) 70.

Figure 8:
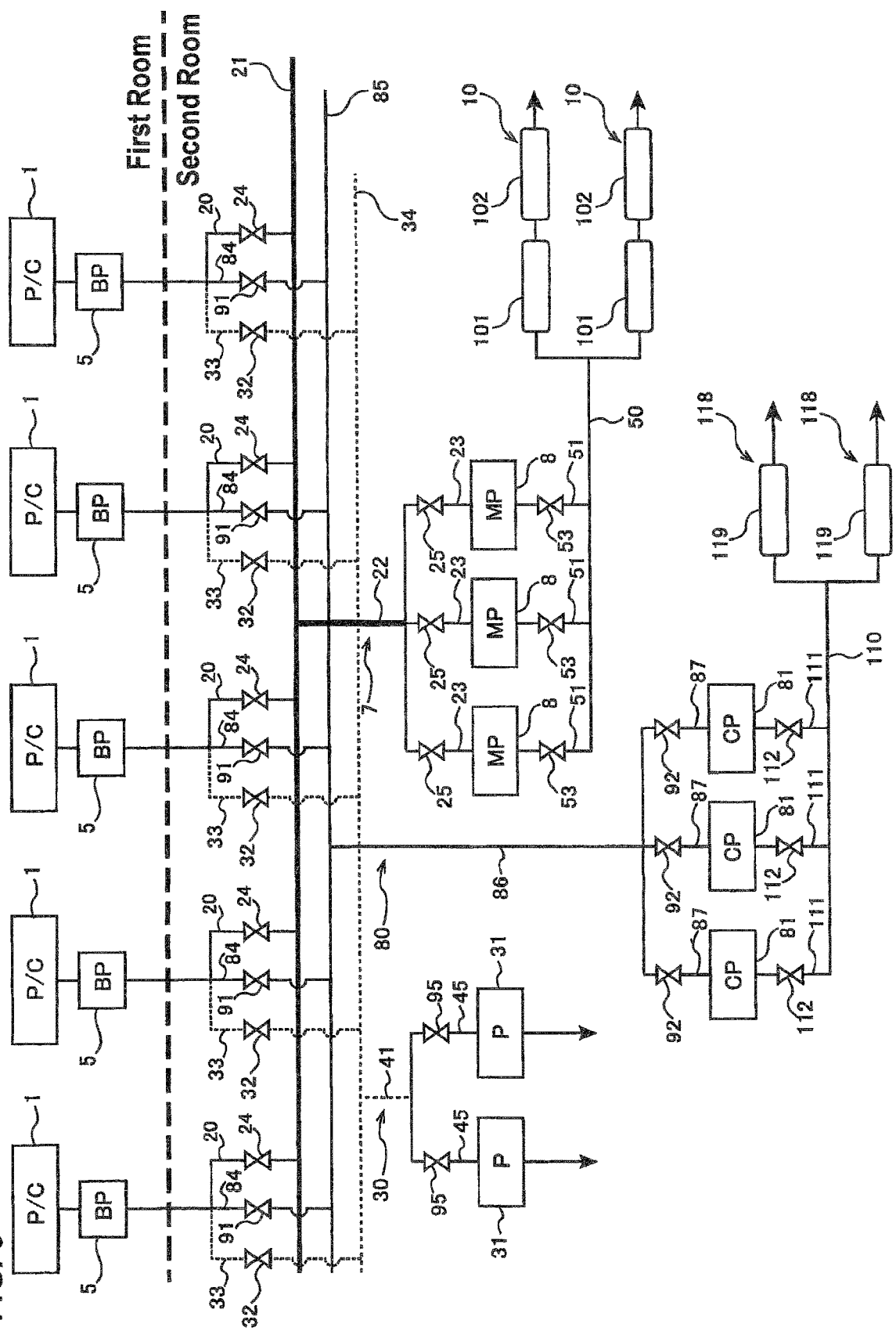
FIG. 8 is a view showing still another embodiment of the vacuum evacuation system.

FIG. 8 is a view showing still another embodiment of the vacuum evacuation system. Structures of this embodiment, which will not be described particularly, are identical to those of the embodiment shown in FIG. 1, and their repetitive descriptions are omitted. Each of process chambers 1 shown in FIG. 8 is a so-called batch-type process chamber in which a plurality of wafers can be processed. A processing gas, such as a raw material gas for use in CVD process, is supplied into each process chamber 1, so that a plurality of wafers are processed in each process chamber 1.

A plurality of first vacuum pumps 5 are coupled to the plurality of process chambers 1, respectively. These first vacuum pumps 5 may be turbo-molecular pumps or positive-displacement vacuum pumps (e.g., Root type vacuum pumps, claw type vacuum pumps, or screw type vacuum pumps). The vacuum in each process chamber 1 is produced by operation of each first vacuum pump 5. These first vacuum pumps 5 are coupled to second vacuum pumps 8 through collecting pipe 7.

In this embodiment, three second vacuum pumps 8 are provided. These second vacuum pumps 8 are arranged in parallel, and are coupled to the collecting pipe 7. Each of the second vacuum pumps 8 is coupled to all of the plurality of first vacuum pumps 5 through the collecting pipe 7. The collecting pipe 7 includes a plurality of exhaust pipes 20 coupled to the plurality of first vacuum pumps 5 respectively, a single horizontal pipe (communication pipe) 21 to which these exhaust pipes 20 are coupled, a single main pipe 22 coupled to the horizontal pipe 21, and a plurality of branch pipes 23 coupled to the main pipe 22. The second vacuum pumps 8 are coupled to the branch pipes 23, respectively. On-off valve 24 is attached to each of the exhaust pipes 20, and similarly, on-off valve 25 is attached to each of the branch pipes 23.

The second vacuum pumps 8 are vacuum pumps each having resistance to the processing gas. In this embodiment, all of the three second vacuum pumps 8 are operated. When one of the three second vacuum pumps 8 has broken down or stopped for its maintenance, the other two second vacuum pumps 8 continue to evacuate the processing gas. In this manner, since the plurality of second vacuum pumps 8 are arranged in parallel, the vacuum evacuation system can continue its operation as a whole during the pump failure or the pump maintenance.

The gas treatment devices 10 are located downstream of the second vacuum pumps 8. In this embodiment, two gas treatment devices 10 are provided in parallel. These gas treatment devices 10 are coupled to the second vacuum pumps 8 through the collecting pipe 50. Each of the gas treatment devices 10 includes a combustion-type abatement unit 101 and a wet-type abatement unit 102. The combustion-type abatement unit 101 and the wet-type abatement unit 102 are arranged in series in this order.

The combustion-type abatement unit 101 is provided for removing silane gas ($SiH_4$) used for CVD (chemical vapor deposition) process, and the wet-type abatement unit 102 is provided for removing powders of $SiO_2$ and an acid gas which are produced by the combustion of the processing gas. The combustion-type abatement unit 101 may be a heater-type abatement unit or a plasma-type abatement unit. The wet-type abatement unit 102 may be omitted so long as an amount of powder emission does not exceed a prescribed value or a concentration of the acid gas does not exceed a regulatory value of emission concentration.

A plurality of cleaning-gas exhaust pumps 81 are coupled to the plurality of first vacuum pumps 5 through a cleaning-gas exhaust pipe 80. In this embodiment, three cleaning-gas exhaust pumps 81 are provided. The cleaning-gas exhaust pipe 80 is in the form of collecting pipe. Specifically, the cleaning-gas exhaust pipe 80 includes a plurality of exhaust pipes 84 coupled to the plurality of first vacuum pumps 5 respectively, a single horizontal pipe (communication pipe) 85 to which these exhaust pipes 84 are coupled, a single main pipe 86 coupled to the horizontal pipe 85, and a plurality of branch pipes 87 coupled to the main pipe 86. The plurality of cleaning-gas exhaust pumps 81 are coupled to the plurality of branch pipes 87, respectively. On-off valve 91 is attached to each of the exhaust pipes 84, and similarly on-off valve 92 is attached to each of the branch pipes 87.

When the CVD process is performed in the process chamber 1, a raw material, which is contained in a raw material gas used as the processing gas, is deposited in the process chamber 1. In order to clean the inside of the process chamber 1, a cleaning gas is supplied into the process chamber 1. The cleaning gas is discharged from the process chamber 1 by the first vacuum pump 5 and the cleaning-gas exhaust pump 81. The cleaning-gas exhaust pumps 81 are vacuum pumps each having resistance to the cleaning gas.

In order to detoxify the cleaning gas that has been exhausted from the cleaning-gas exhaust pumps 81, exhaust-gas treatment devices 118 are provided downstream of the cleaning-gas exhaust pumps 81. These exhaust-gas treatment devices 118 are constituted by wet-type abatement units 119. The exhaust-gas treatment devices 118 may be of other type, such as combustion-type abatement units. The exhaust-gas treatment devices 118 are coupled to the cleaning-gas exhaust pumps 81 through a collecting pipe 110. The collecting pipe 110 includes a plurality of exhaust pipes 111 coupled to the plurality of cleaning-gas exhaust pumps 81, respectively. On-off valves 112 are attached to these exhaust pipes 111, respectively.

A plurality of roughing pumps 31 are coupled to the plurality of first vacuum pumps 5 through an atmospheric-air exhaust pipe 30. In this embodiment, two roughing pumps 31 are provided. The atmospheric-air exhaust pipe 30 is in the form of collecting pipe. Specifically, the atmospheric-air exhaust pipe 30 includes a plurality of exhaust pipes 33 coupled to the plurality of first vacuum pumps 5 respectively, a single horizontal pipe (communication pipe) 34 to which these exhaust pipes 33 are coupled, a single main pipe 41 coupled to the horizontal pipe 34, and a plurality of branch pipes 45 coupled to the main pipe 41. The plurality of roughing pumps 31 are coupled to the plurality of branch pipes 45, respectively. On-off valve 32 is attached to each of the exhaust pipes 33, and similarly on-off valve 95 is attached to each of the branch pipes 45.

The roughing pumps 31 are configured to be able to operate under the atmospheric pressure. During normal operation, all of the on-off valves 32, 95, which are attached to the atmospheric-air exhaust pipe 30, are closed, and the roughing pumps 31 are not in operation. The roughing pumps 31 are used to evacuate the atmospheric air from the process chamber(s) 1. For example, after maintenance of a certain process chamber 1 is finished, only the on-off valve 32, which communicates with that process chamber 1 filled with the atmospheric air, is opened, and the on-off valves 95 are opened. Further the roughing pumps 31 are started. The atmospheric air in the process chamber 1 is exhausted by the roughing pumps 31 through the atmospheric-air exhaust pipe 30. The gas treatment device 10 is not provided downstream of the roughing pumps 31.

The collecting pipe 7, the cleaning-gas exhaust pipe 80, and the atmospheric-air exhaust pipe 30 are arranged in parallel. The processing gas, the cleaning gas, and the atmospheric air are exhausted through separated routes by the separated vacuum pumps 8, 81, 31. Therefore, based on the kind of gas to be exhausted, an optimal pump can be selected for each of the second vacuum pumps 8, the cleaning-gas exhaust pumps 81, and the roughing pumps 31.

Further, an optimal abatement unit can be selected based on the kind of gas to be exhausted.

The first vacuum pumps 5 are disposed in the first room (for example, clean room), and the second vacuum pumps 8, the cleaning-gas exhaust pumps 81, and the roughing pumps 31 are disposed in another room (second room) which is separated from the clean room. For example, the first room is located upstairs, and the second room is located downstairs. As with the embodiment shown in FIG. 1, the first vacuum pumps 5 are arranged adjacent to the process chambers 1.

Figure 9:
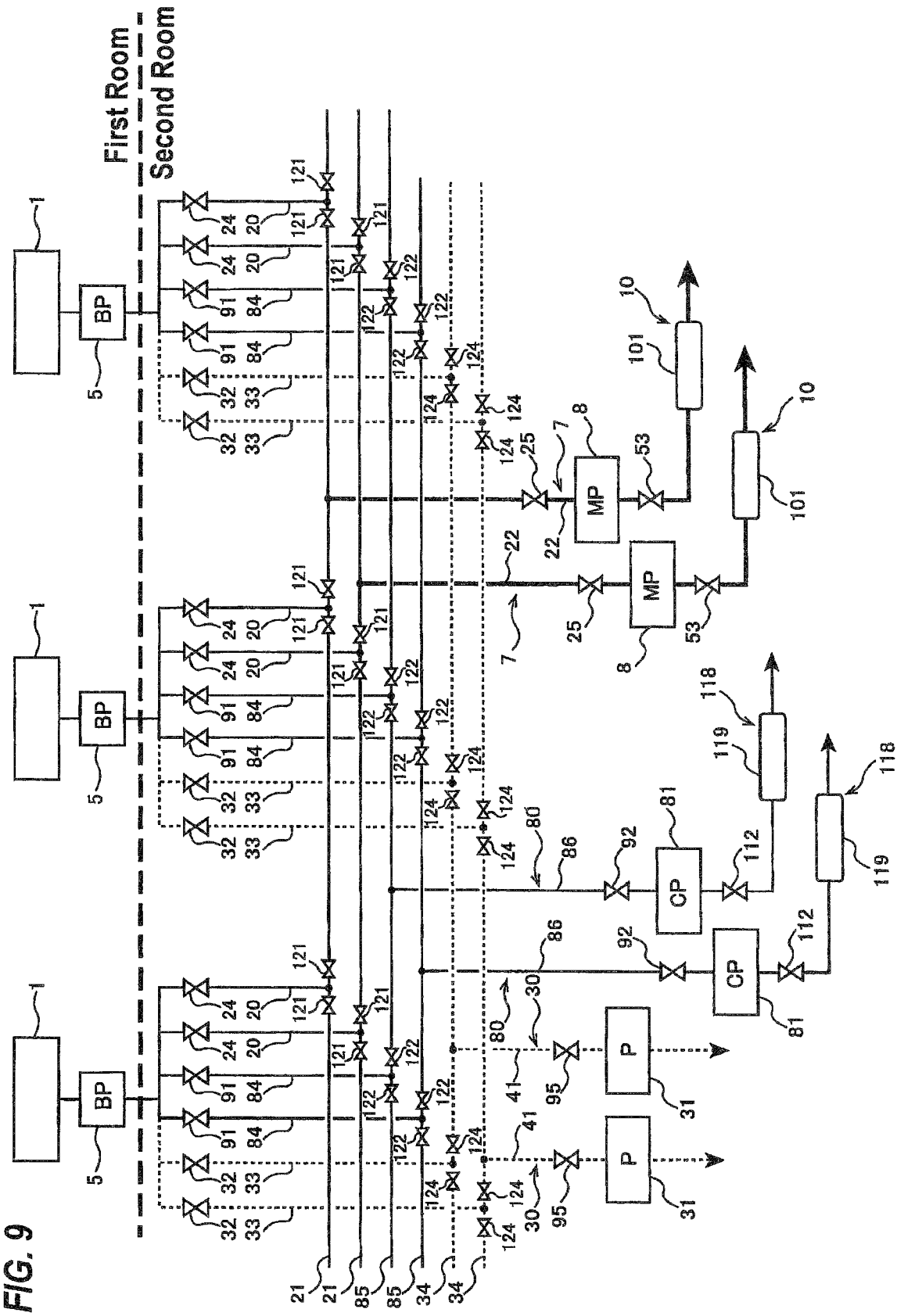
FIG. 9 is a view showing still another embodiment of the vacuum evacuation system.

FIG. 9 is a view showing still another embodiment of the vacuum evacuation system. Structures of this embodiment, which will not be described particularly, are identical to those of the embodiment shown in FIG. 8, and their repetitive descriptions are omitted. In this embodiment, two collecting pipes 7 are arranged in parallel, and two second vacuum pumps 8 are also arranged in parallel. These second vacuum pumps 8 are coupled to the plurality of first vacuum pumps 5 through these collecting pipes 7. Two gas treatment devices 10 are coupled to the two second vacuum pumps 8, respectively. Combustion-type abatement units 101 are employed as the gas treatment devices 10. A plurality of shutoff valves 121 are attached to the horizontal pipe (communication pipe) 21 of each collecting pipe 7. The shutoff valves 121 are arranged at both sides of connection point between each exhaust pipe 20 and the horizontal pipe 21.

Similarly, two cleaning-gas exhaust pipes 80 are arranged in parallel, and two cleaning-gas exhaust pumps 81 are also arranged in parallel. These cleaning-gas exhaust pumps 81 are coupled to the plurality of first vacuum pumps 5 through these cleaning-gas exhaust pipes 80. A plurality of shutoff valves 122 are attached to the horizontal pipe (communication pipe) 85 of each cleaning-gas exhaust pipe 80. The shutoff valves 122 are arranged at both sides of connection point between each exhaust pipe 84 and the horizontal pipe 85.

Further, two atmospheric-air exhaust pipes 30 are arranged in parallel, and two roughing pumps 31 are also arranged in parallel. These roughing pumps 31 are coupled to the plurality of first vacuum pumps 5 through these atmospheric-air exhaust pipes 30. A plurality of shutoff valves 124 are attached to the horizontal pipe (communication pipe) 34 of each atmospheric-air exhaust pipe 30. The shutoff valves 124 are arranged at both sides of connection point between each exhaust pipe 33 and the horizontal pipe 34.

The embodiment shown in FIG. 9 includes the two collecting pipes 7 to which the on-off valves 24 and the shutoff valves 121 are attached, the two second vacuum pumps 8 coupled to these collecting pipes 7 respectively, and the two gas treatment device 10 coupled to these two second vacuum pumps 8 respectively. With such structures, when maintenance of a certain exhaust chamber 1 of the plurality of exhaust chambers 1 is to be performed, a communication between that exhaust chamber 1 and the other exhaust chambers 1 can be shut off.

Figure 10:
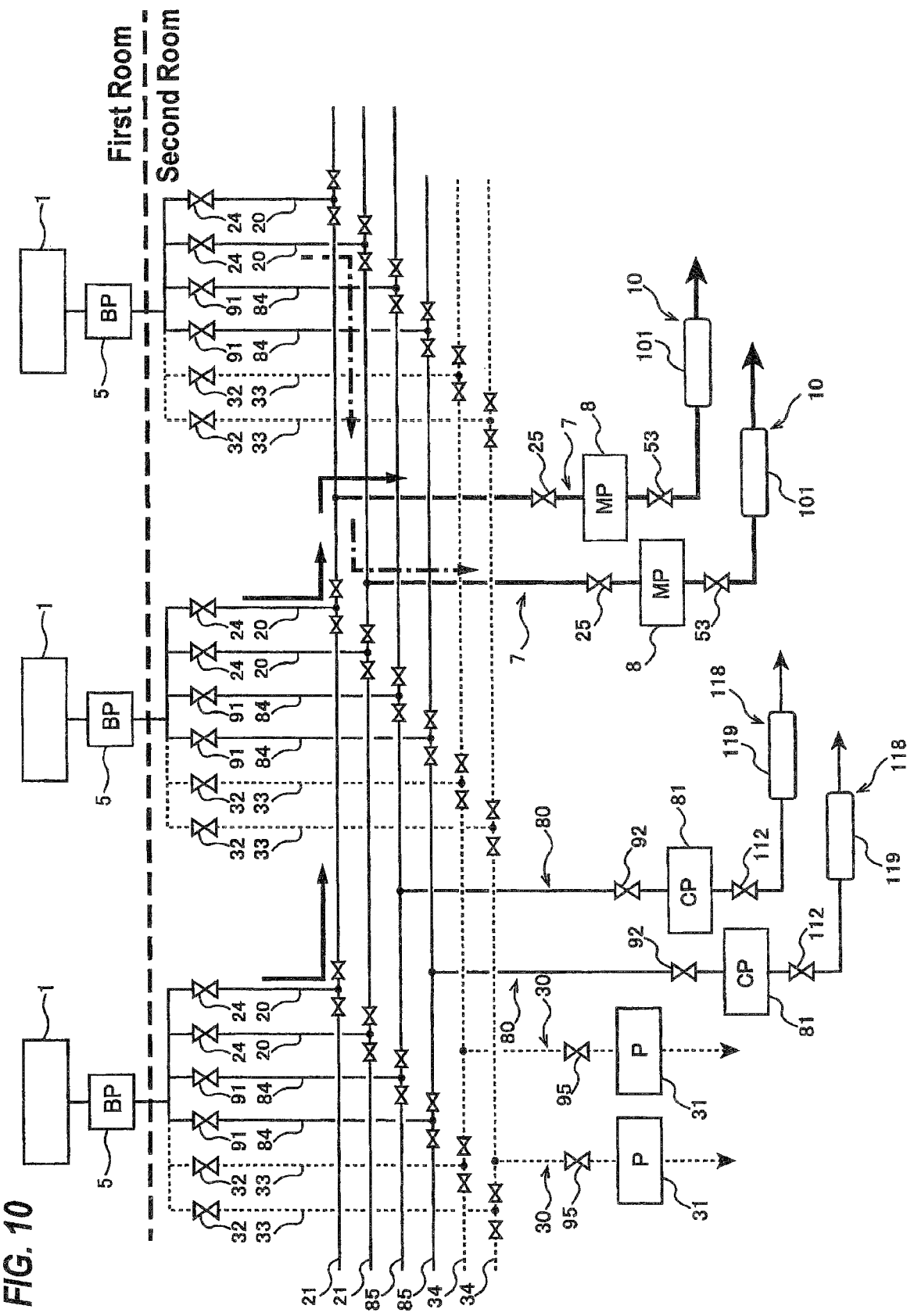
FIG. 10 is a view showing an example of operations of the vacuum evacuation system shown in FIG. 9.

Further, as shown in FIG. 10, only certain exhaust chamber(s) 1 can communicate with one of the two collecting pipes 7, while the other exhaust chamber(s) 1 can communicate with the other collecting pipe 7. In such a case, a pumping speed for the certain exhaust chamber(s) 1 can be set to be higher than a pumping speed for the other exhaust chamber(s) 1. Further, a type of processing gas evacuated from the certain exhaust chamber(s) 1 may be different from a type of processing gas evacuated from the other exhaust chamber(s) 1.

Figure 11:
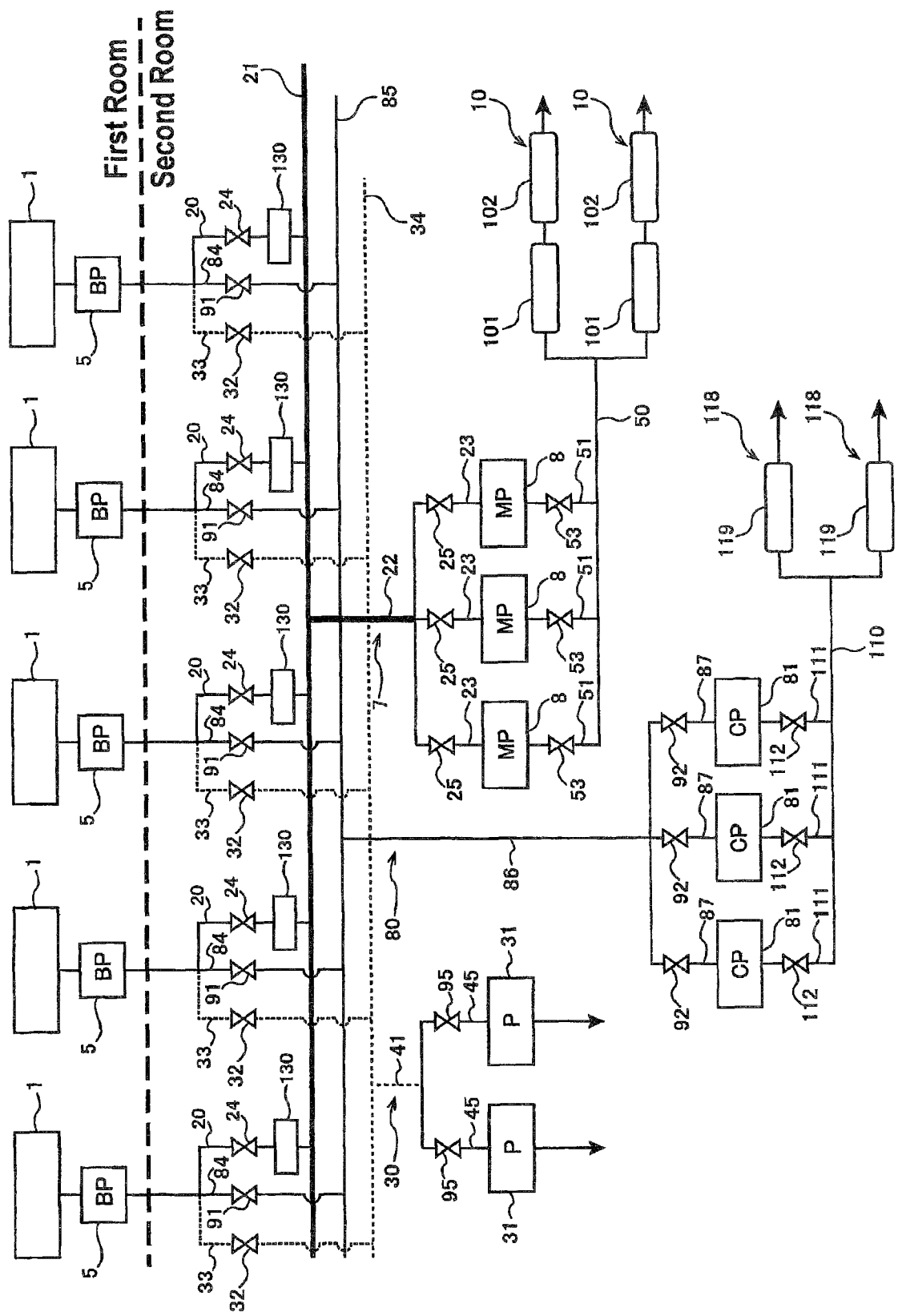
FIG. 11 is a view showing still another embodiment of the vacuum evacuation system.

FIG. 11 is a view showing still another embodiment of the vacuum evacuative system. Structures of this embodiment, which will not be described particularly, are identical to those of the embodiment shown in FIG. 8, and their repetitive descriptions are omitted. In this embodiment, abatement units 130 are attached to the collecting pipe 7. More specifically, a plurality of abatement units 130 are attached to the plurality of exhaust pipes 20 of the collecting pipe 7, respectively.

This embodiment is suitable for a low-pressure CVD process for forming a silicon nitride film in the process chamber 1. In the low-pressure CVD process for forming the silicon nitride film, ammonium chloride ($NH_4Cl$) is produced as a by-product. This ammonium chloride has a property of subliming under the atmospheric pressure at a temperature of about 330° C. Accordingly, although ammonium chloride exists in the gaseous state under high vacuum, ammonium chloride is likely to be solidified due to an increased pressure.

If the by-product, such as ammonium chloride, is solidified in the vacuum pump, a frequency of maintenance of the vacuum pump is increased. In order not to increase the frequency of maintenance, it is necessary to heat the processing gas to a high temperature so as to keep the by-product in the gaseous state. However, heating of the processing gas entails an increase in energy usage. Moreover, depending on a processing condition, the gaseous state may not be kept only by heating of the processing gas.

Thus, in this embodiment, the abatement unit 130 is disposed near the outlet of the first vacuum pump 5, so that the abatement unit 130 decomposes the processing gas (i.e., breaks the processing gas into low molecules). With such structure, a gas of ammonium chloride does not exist at the downstream side of the abatement unit 130, and as a result, ammonium chloride is not solidified. Therefore, it is not required to keep the processing gas at a high temperature, and an energy saving can be achieved. Further, since a load on the second vacuum pumps 8 can be reduced, the second vacuum pumps 8 can be simplified in structure, and the frequency of maintenance of the second vacuum pumps 8 can be reduced.

Figure 12:
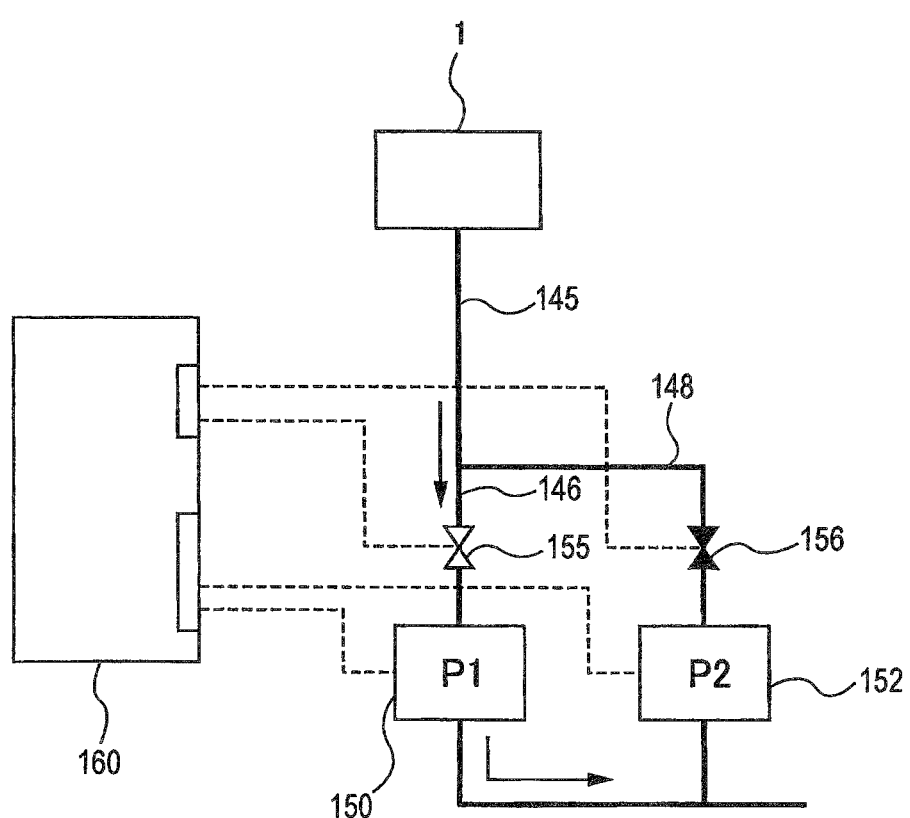
FIG. 12 is a schematic view showing an embodiment of a vacuum evacuation system.

FIG. 12 is a schematic view showing an embodiment of a vacuum evacuation system. As shown in FIG. 12, the vacuum evacuation system includes a suction pipe 145, a branch pipe 146 and a backup pipe 148 which branch off from the suction pipe 145, a vacuum pump 150 coupled to the branch pipe 146, and a backup pump 152 coupled to the backup pipe 148. The suction pipe 145 is coupled to a process chamber 1 installed in a semiconductor-device manufacturing apparatus, such as a CVD apparatus, a PVD apparatus, an etching apparatus, or the like.

An on-off valve 155 and a backup valve 156 are attached to the branch pipe 146 and the backup pipe 148, respectively. The on-off valve 155 and the backup valve 156 are coupled to an operation controller 160 through signal lines, so that opening and closing operations of the on-off valve 155 and the backup valve 156 are controlled by the operation controller 160. The vacuum pump 150 and the backup pump 152 are coupled to the operation controller 160 by way of wireless communication or wire communication, so that operations of the vacuum pump 150 and the backup pump 152 are controlled by the operation controller 160. Examples of the wire communication include a digital communication and an analog communication.

Each of the vacuum pump 150 and the backup pump 152 has a motor and an inverter (not shown). Present values of rotational speed of the vacuum pump 150 and the backup pump 152 are sent from the inverters to the operation controller 160. A signal indicating the present value of the rotational speed may be a communication signal, a signal converted into an analog signal (e.g., a voltage or an electric current), or a signal converted into a pulse signal.

During a normal operation, the on-off valve 155 is opened, while the backup valve 156 is closed. Both of the vacuum pump 150 and the backup pump 152 are operated. Therefore, in the normal operation, a processing gas in the process chamber 1 is evacuated by the vacuum pump 150. The operation controller 160 includes an analog-signal output terminal or a digital-signal output terminal (not shown) for sending operation states of the vacuum pump 150 and the backup pump 152, operational malfunctions of the pumps, and opened and closed states of the on-off valve 155 and the backup valve 156, to a host machine.

During manufacturing of semiconductor devices, a processing gas is injected into the process chamber 1, while the vacuum pump 150 evacuates the processing gas from the process chamber 1 so as to keep the inside of the process chamber 1 at a low pressure. The semiconductor-device manufacturing apparatus includes a pressure sensor (not shown) for measuring a pressure in the process chamber 1. When the pressure in the process chamber 1 exceeds a pressure upper limit that indicates an extraordinary increase in the pressure, the semiconductor-device manufacturing apparatus forcibly stops its operation. Therefore, after the manufacturing of the semiconductor devices is started, it is necessary to keep the pressure in the process chamber 1 lower than the pressure upper limit. However, if the processing gas is solidified in the vacuum pump 150 and depositions are formed therein, the rotational speed of the vacuum pump 150 is lowered, thus possibly causing a significant increase in the pressure in the process chamber 1.

Figure 13:
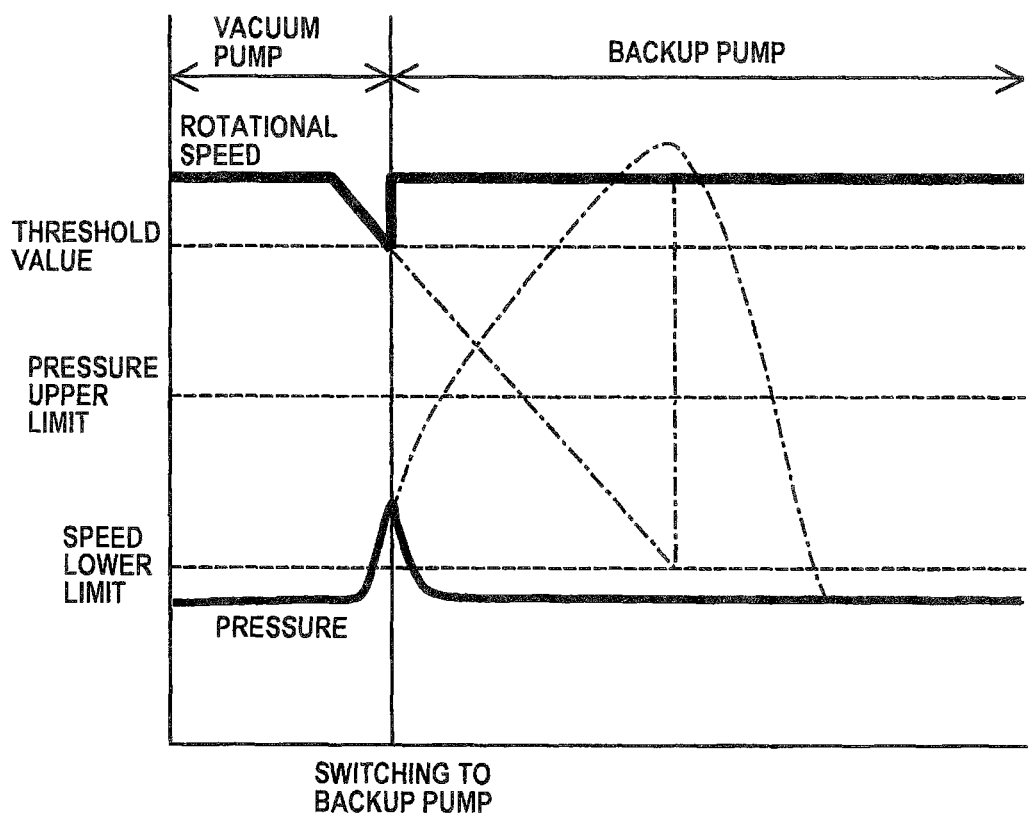
FIG. 13 is a graph illustrating a temporal change in rotational speed of a vacuum pump and a temporal change in suction-side pressure of the vacuum pump.

Thus, in this embodiment, before the pressure in the process chamber 1 reaches the pressure upper limit, the backup pump 152 is started to evacuate the processing gas from the process chamber 1. FIG. 13 is a graph illustrating temporal changes in the rotational speed of the vacuum pump 150 and suction-side pressure of the vacuum pump 150 (i.e., pressure in the process chamber 1). In the graph of FIG. 13, a vertical axis represents the rotational speed and the suction-side pressure, and a horizontal axis represents time.

As shown in FIG. 13, the operation controller 160 memorizes (stores) in advance a threshold value therein for switching the vacuum evacuation operation from the vacuum pump 150 to the backup pump 152. The operation controller 160 is configured to open the backup valve 156 and close the on-off valve 155 when the rotational speed of the vacuum pump 150 is lower than the threshold value.

Figure 14:
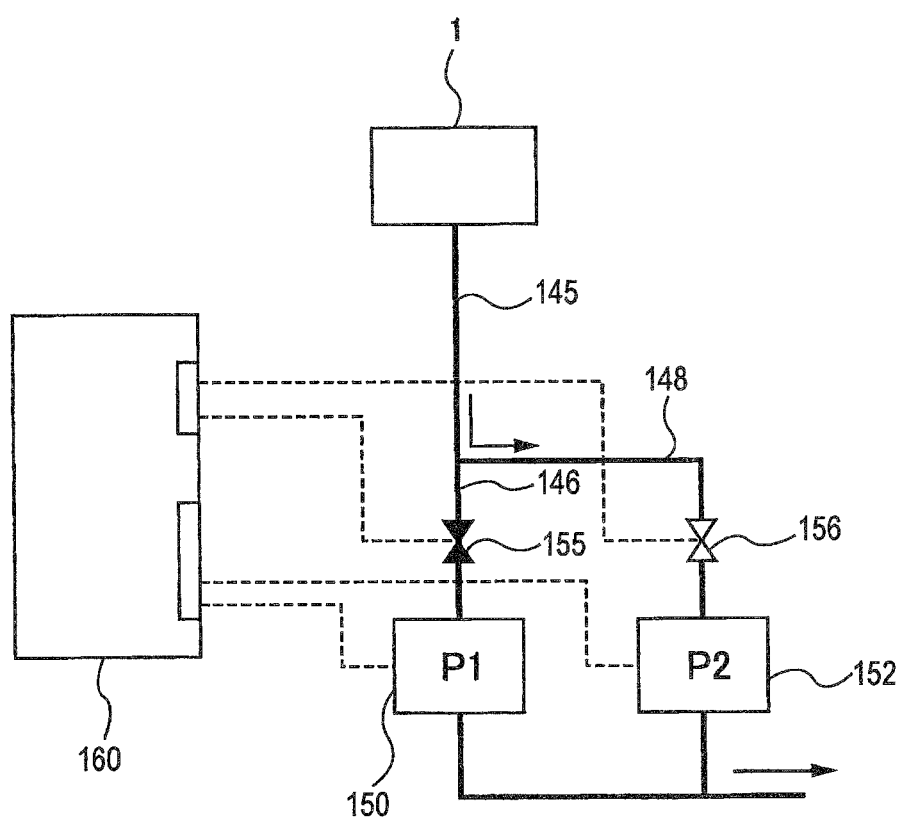
FIG. 14 is a view showing a state in which a backup valve is opened and an on-off valve is closed.

FIG. 14 is a view showing a state in which the backup valve 156 is opened and the on-off valve 155 is closed. As shown in FIG. 14, when the backup valve 156 is opened and the on-off valve 155 is closed, the suction pipe 145 communicates with the backup pump 152, while the communication between the suction pipe 145 and the vacuum pump 150 is shut off. Therefore, the processing gas in the process chamber 1 coupled to the suction pipe 145 is sucked by the backup pump 152.

Figure 15:
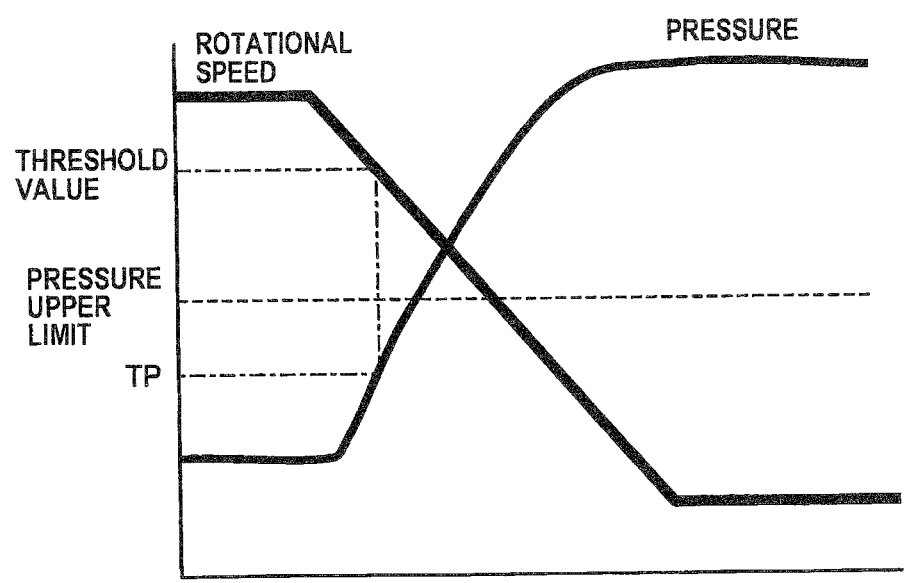
FIG. 15 is a graph illustrating a relationship between the rotational speed of the vacuum pump and the suction-side pressure of the vacuum pimp.

The threshold value is determined in advance based on a relationship between the rotational speed of the vacuum pump 150 and the suction-side pressure of the vacuum pump 150 (i.e., the pressure in the process chamber 1). FIG. 15 is a graph illustrating the relationship between the rotational speed of the vacuum pump 150 and the suction-side pressure of the vacuum pump 150. As can be seen from the graph show in the FIG. 15, the rotational speed of the vacuum pump 150 is approximately in inverse proportion to the suction-side pressure of the vacuum pump 150.

The threshold value in this embodiment is a threshold value with respect to the rotational speed of the vacuum pump 150. As shown in FIG. 15, the threshold value represents a preset rotational speed which corresponds to a suction-side pressure TP, which is lower than the above-described pressure upper limit that has been set in the semiconductor-device manufacturing apparatus. More specifically, the suction-side pressure TP of the vacuum pump 150 when the rotational speed of the vacuum pump 150 is equal to the threshold value is lower than the pressure upper limit. Therefore, as shown in FIG. 13, when malfunction of the vacuum pump 150 has occurred, the rotational speed of the vacuum pump 150 reaches the threshold value before the suction-side pressure reaches the pressure upper limit, and as a result, the vacuum evacuation is started by the backup pump 152. The suction-side pressure is immediately lowered, and is kept at its original value.

Figure 16:
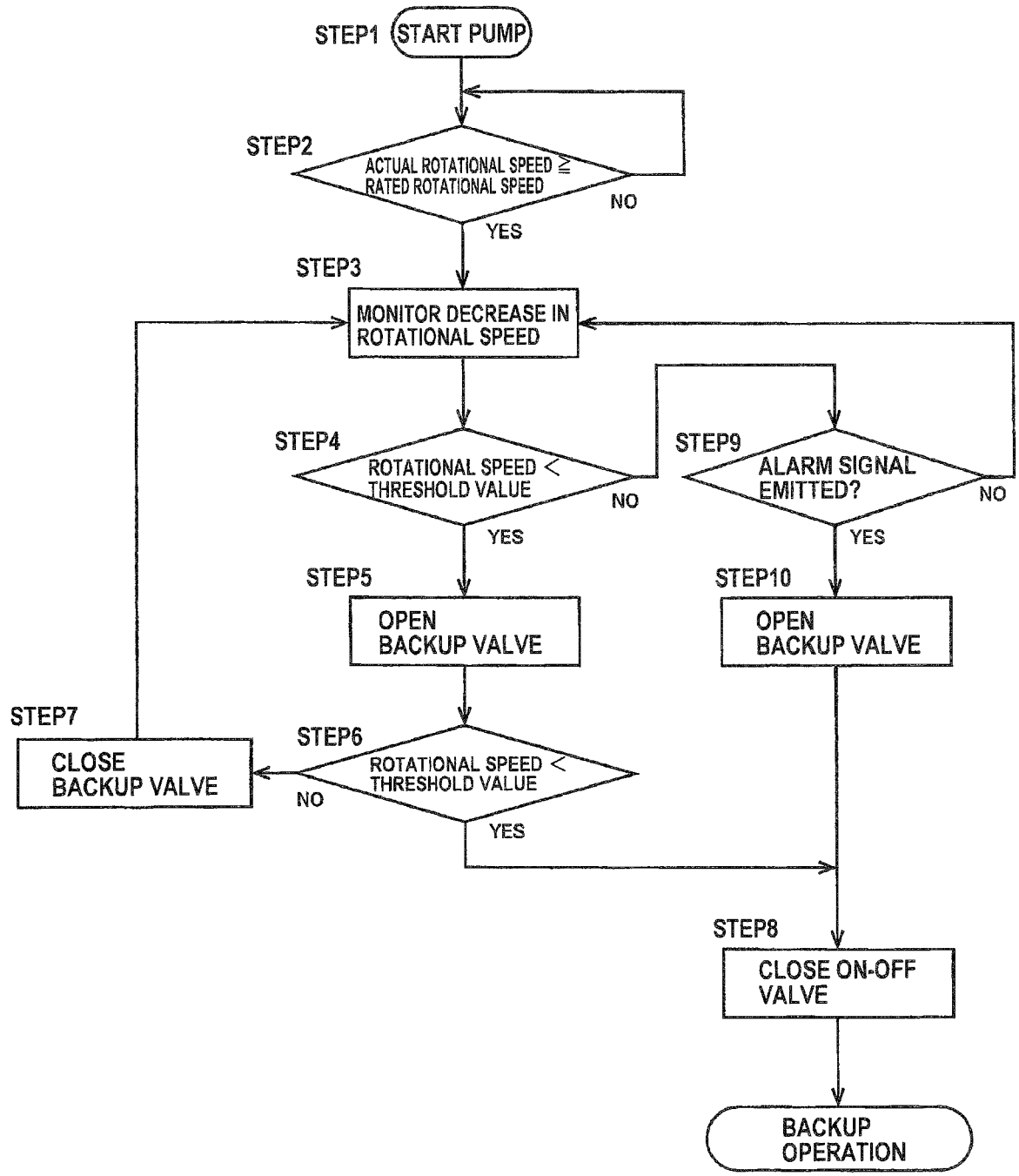
FIG. 16 is a flowchart illustrating a backup operation.

Next, the backup operation according to this embodiment will be described with reference to a flowchart of FIG. 16. In step 1, the vacuum pump 150 is started. Simultaneously with or after the starting of the vacuum pump 150, the backup pump 152 is started. The operation controller 160 judges whether an actual rotational speed of the vacuum pump 150 is equal to or higher than a rated rotational speed of the vacuum pump 150 (step 2). If the actual rotational speed of the vacuum pump 150 is equal to or higher than the rated rotational speed, the operation controller 160 starts monitoring of a decrease in the rotational speed of the vacuum pump 150 (step 3).

The operation controller 160 compares the rotational speed of the vacuum pump 150 with the threshold value, and judges whether the rotational speed of the vacuum pump 150 is lower than the threshold value (step 4). If the rotational speed of the vacuum pump 150 is lower than the threshold value, the operation controller 160 opens the backup valve 156 (step 5).

The operation controller 160 judges again whether the rotational speed of the vacuum pump 150 is lower than the threshold value (step 6). The reason of this is that a temporal decrease in the rotational speed can occur due to some causes, such as entering of foreign matters. If the rotational speed of the vacuum pump 150 increases until it exceeds the threshold value again, the operation controller 160 closes the backup valve 156 (step 7), and starts again monitoring of the decrease in the rotational speed of the vacuum pump 150 of the step 3. In the above-described step 6, if the rotational speed of the vacuum pump 150 is lower than the threshold value, the operation controller 160 closes the on-off valve 155 (step 8), whereby the backup operation is started.

In order to reduce power consumption, the backup pump 152 may be in a standby operation until the backup operation is started. More specifically, when the rotational speed of the vacuum pump 150 is equal to or higher than the threshold value, the backup pump 152 may be operated at a first rotational speed, and when the rotational speed of the vacuum pump 150 is lower than the threshold value, the backup pump 152 may be operated at a second rotational speed which is higher than the first rotational speed. In order to avoid a pressure raise when switching to the backup operation, the above-described first rotational speed may preferably be equal to or higher than the threshold value.

In the above-described step 4, if the rotational speed of the vacuum pump 150 is equal to or higher than the threshold value, the operation controller 160 judges whether an alarm signal has been emitted from the vacuum pump 150 (step 9). This alarm signal is emitted from the vacuum pump 150 to the operation controller 160 when a failure, such as an extraordinary increase in temperature of the vacuum pump 150, or a communication failure, has occurred. If the alarm signal is not emitted, the operation controller 160 starts again monitoring of the decrease in the rotational speed of the step 3. If the alarm signal has been emitted, the operation controller 160 opens the backup valve 156 (step 10), and further closes the on-off valve 155 (step 8), whereby the backup operation is started.

In general, the processing gas for use in the manufacturing of semiconductor devices has a property of being solidified with a temperature drop. Therefore, the processing gas may be solidified in the vacuum pump 150, thus forming depositions, which may inhibit the rotation of the pump rotor. Thus, the vacuum pump 150 has a function to emit a speed drop signal, which indicates an extraordinary decrease in the rotational speed, when the rotational speed of the vacuum pump 150 is lowered to a preset speed lower limit. The speed drop signal is transmitted to the operation controller 160. The operation controller 160 is configured to stop the operation of the vacuum pump 150 when receiving this speed drop signal. The above-described threshold value is larger than the speed lower limit. The operation controller 160 may be configured to open the backup valve 156 and close the on-off valve 155 when the operation controller 160 receives the speed drop signal.

The reason for closing the backup valve 156 during the operation of vacuum pump 150 is to prevent the processing gas from being solidified in the backup pump 152. Further, the reason for operating the backup pump 152 despite the fact that the backup valve 156 is closed during the operation of the vacuum pump 150 is to enable the backup pump 152 to immediately start the evacuating operation when the pump operation is switched, thereby preventing the pressure increase in the process chamber 1.

In this embodiment, the rotational speed of the vacuum pump 150 is a pressure index value which indirectly indicates the suction-side pressure. By using the rotational speed of the vacuum pump 150 as the pressure index value, a pressure sensor for measuring the suction-side pressure is not necessary. Therefore, without installing a pressure sensor in an existing apparatus, such as the semiconductor-device manufacturing apparatus, or without connecting an existing pressure sensor with a signal line, it is possible to readily incorporate the vacuum evacuation system according to this embodiment into the existing apparatus.

Figure 17:
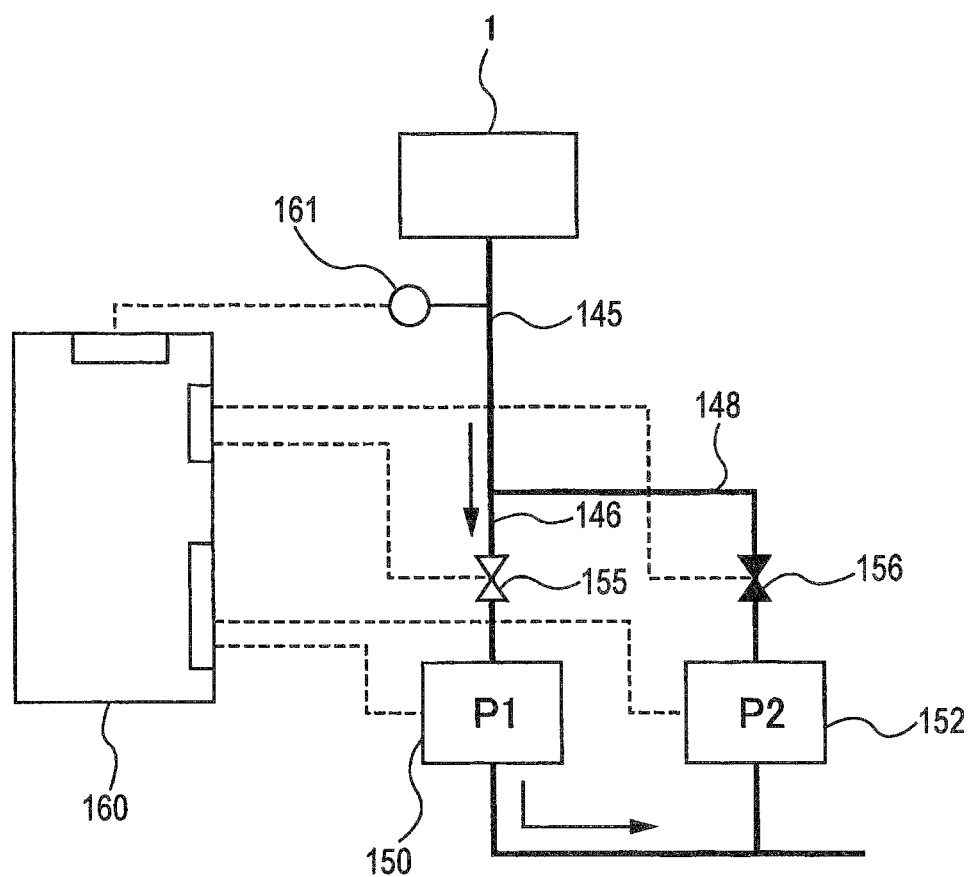
FIG. 17 is a schematic view showing another embodiment of the vacuum evacuation system.

In a case where a semiconductor-device manufacturing apparatus is newly installed, the vacuum evacuation system may be incorporated, together with a pressure sensor, into the semiconductor-device manufacturing apparatus. In such a case, the pressure sensor may be connected with the operation controller 160, and the operation controller 160 may judge a measured value of the suction-side pressure with the threshold value. FIG. 17 is a schematic view showing another embodiment of the vacuum evacuation system. Structures and operations, which will not be described particularly, are identical to those of the embodiment shown in FIGS. 12 to 16, and their repetitive descriptions are omitted. In this embodiment, a pressure sensor 161 is coupled to the suction pipe 145. The pressure sensor 161 measures the suction-side pressure of the vacuum pump 150 (i.e., the pressure in the suction pipe 145 and the process chamber 1), and sends a measured value of the suction-side pressure to the operation controller 160. In this embodiment, the measured value of the suction-side pressure is a pressure index value which directly indicates the suction-side pressure.

The operation controller 160 compares the measured value of the suction-side pressure with the threshold value to thereby judge whether to start the backup operation. The threshold value in this embodiment is a threshold value with respect to the suction-side pressure of the vacuum pump 150. The operation controller 160 opens the backup valve 156 and closes the on-off valve 155 when the measured value of the suction-side pressure has reached the threshold value.

Figure 18:
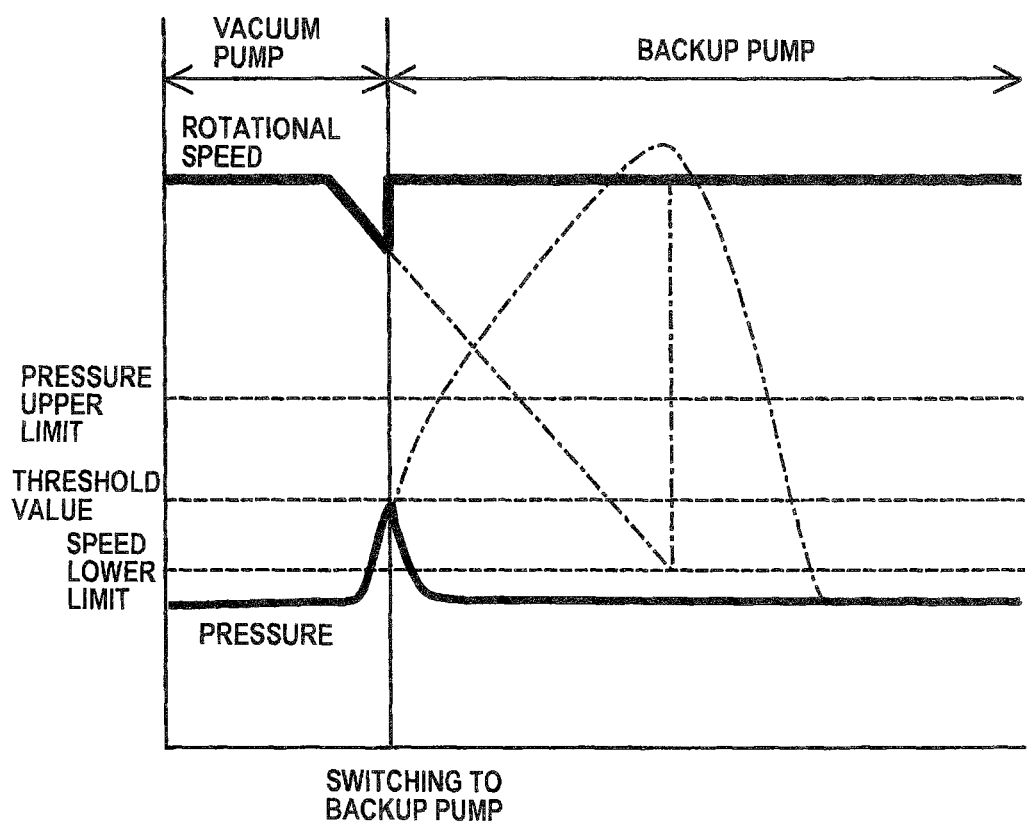
FIG. 18 is a view illustrating a threshold value used in the embodiment shown in FIG. 17.

FIG. 18 is a view illustrating the threshold value used in the embodiment shown in FIG. 17. As shown in FIG. 18, the threshold value is lower than the aforementioned pressure upper limit that is set in the semiconductor-device manufacturing apparatus. Therefore, when malfunction of the vacuum pump 150 has occurred, the suction-side pressure reaches the threshold value before the suction-side pressure reaches the pressure upper limit, and the vacuum evacuation is started by the backup pump 152.

Figure 19:
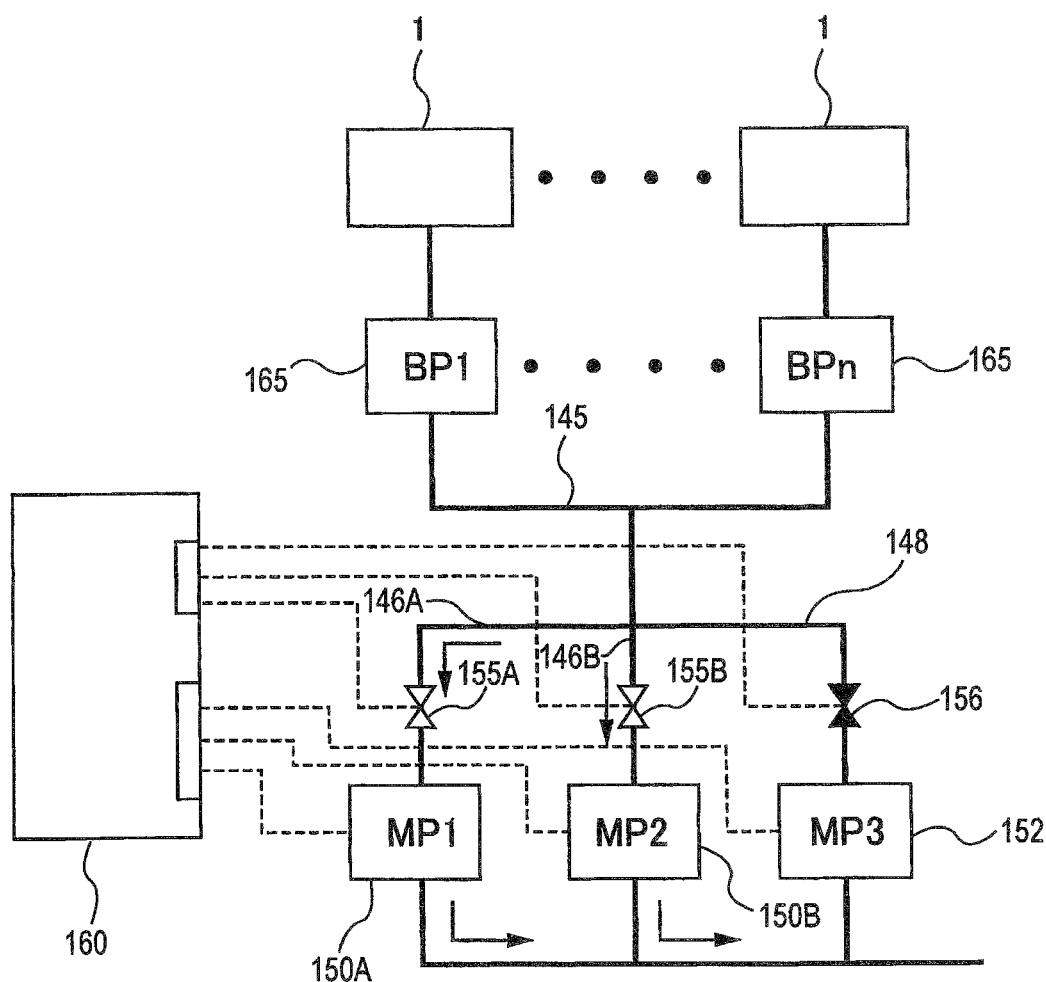
FIG. 19 is a view showing still another embodiment of the vacuum evacuation system.

FIG. 19 is a schematic view showing still another embodiment of the vacuum evacuation system. Structures and operations, which will not be described particularly, are identical to those of the embodiment shown in FIGS. 12 to 16, and their repetitive descriptions are omitted. In this embodiment, the suction pipe 145 is constituted by a collecting pipe. Hereinafter, the suction pipe 145 will be referred to as collecting pipe 145. A plurality of inlets of the collecting pipe 145 are coupled to exhaust outlets of a plurality of booster pumps 165, respectively. These booster pumps 165 are coupled to a plurality of process chambers 1, respectively.

A first branch pipe 146A, a second branch pipe 146B, and the backup pipe 148 branch off from the collecting pipe 145, and are coupled to a vacuum pump 150A, a vacuum pump 150B, and the backup pump 152, respectively. Each of the vacuum pump 150A, the vacuum pump 150B, and the backup pump 152 serves as a main pump. A first on-off valve 155A, a second on-off valve 155B, and the backup valve 156 are attached to the first branch pipe 146A, the second branch pipe 146B, and the backup pipe 148, respectively.

Figure 20:
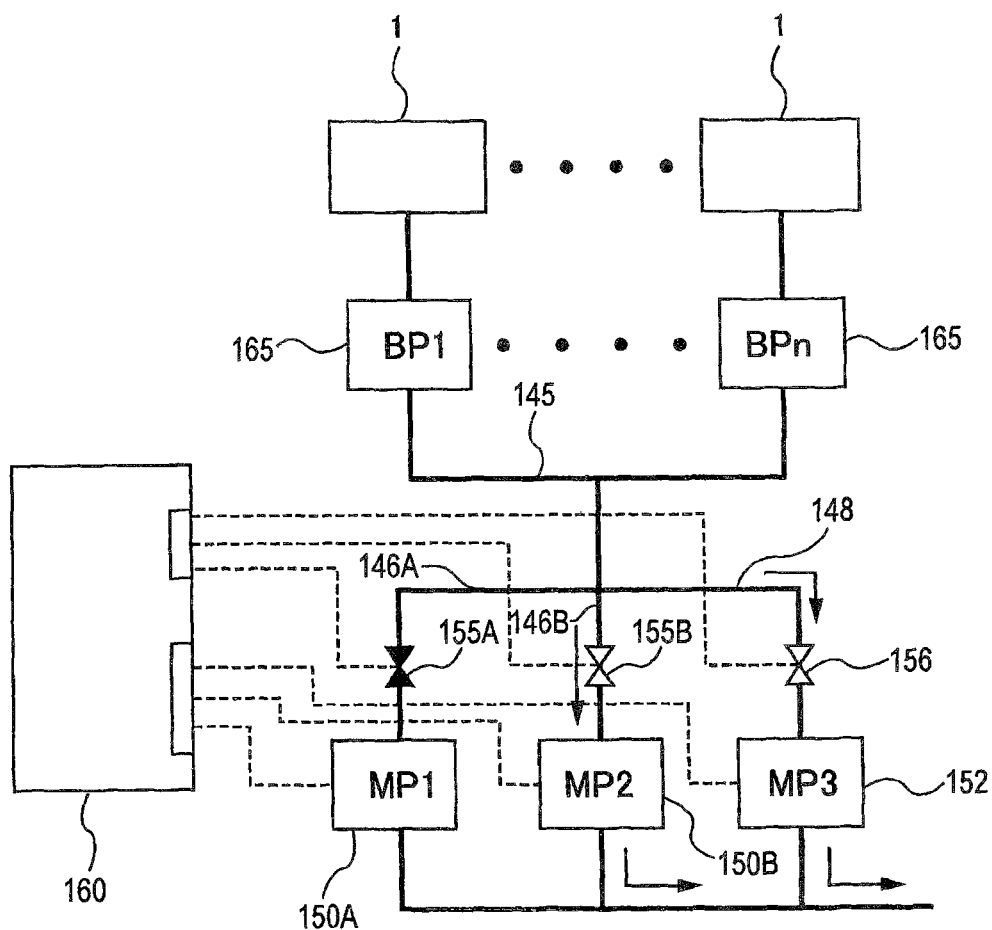
FIG. 20 is a view showing a state in which the backup valve is opened and a first on-off valve is closed.
Figure 21:
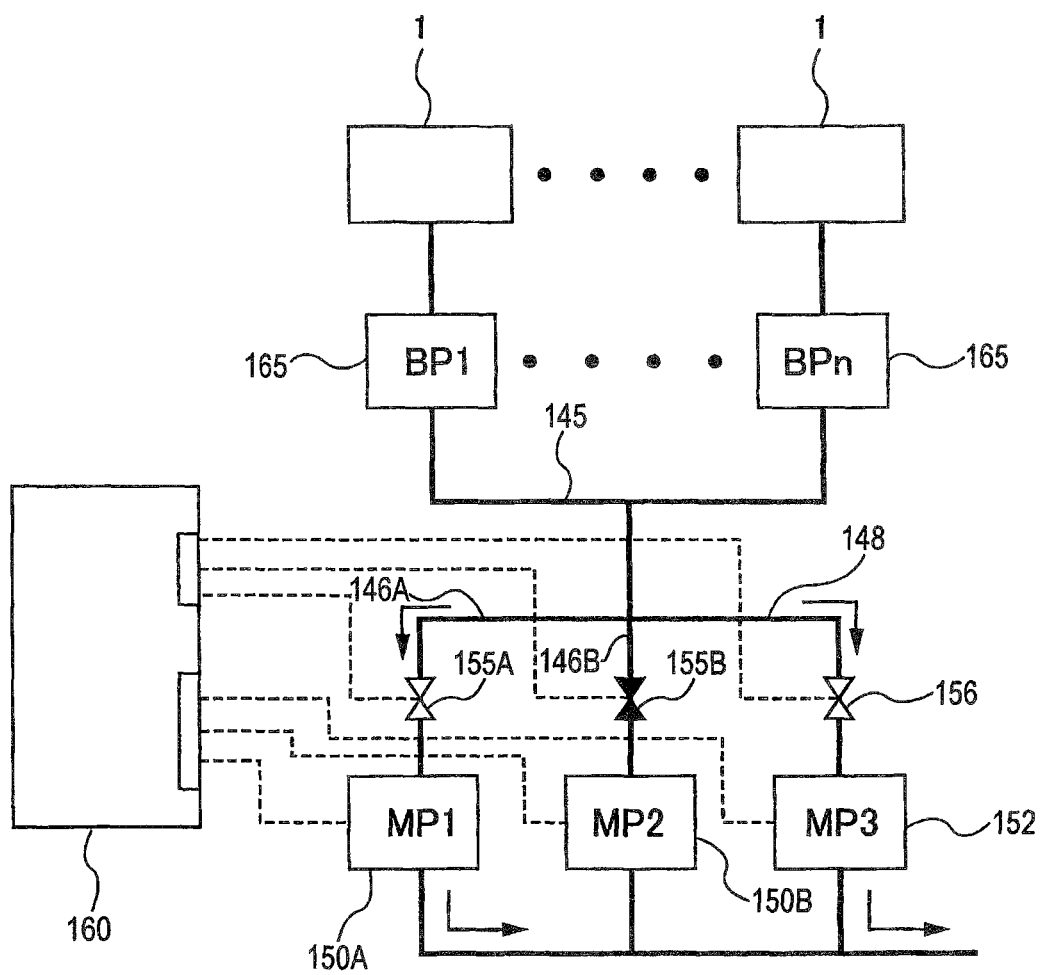
FIG. 21 is a view showing a state in which the backup valve is opened and a second on-off valve is closed.
Figure 22:
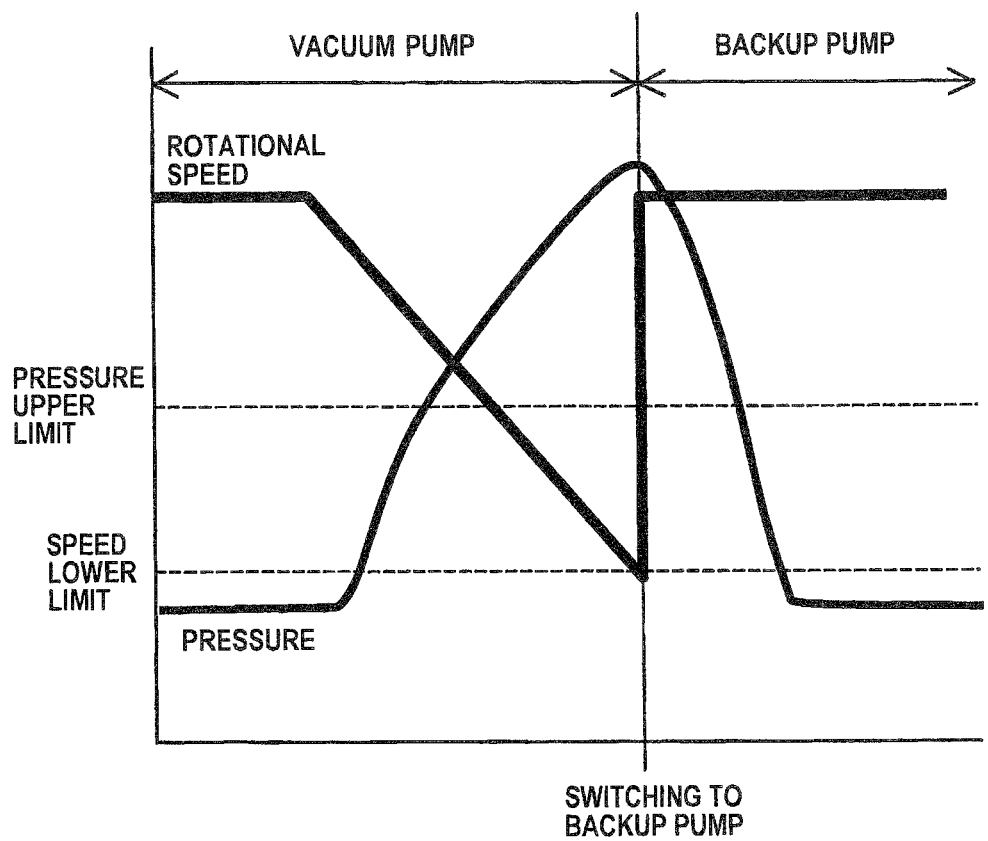
FIG. 22 is a view illustrating a conventional backup operation.

In this embodiment, switching from the normal operation to the backup operation is performed in the same manner as the embodiment explained with reference to FIGS. 12 to 16. Specifically, if the rotational speed of the vacuum pump 150A is lower than the threshold value, the operation controller 160 opens the backup valve 156 and closes the first on-off valve 155A as shown in FIG. 20. If the rotational speed of the vacuum pump 150B is lower than the threshold value, the operation controller 160 opens the backup valve 156 and closes the second on-off valve 155B as shown in FIG. 21.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a vacuum evacuation system used to evacuate a processing gas from one or more process chambers for use in, for example, a semiconductor-device manufacturing apparatus.

1 process chamber
5 first vacuum pump
7 first collecting pipe
8 second vacuum pump
10 gas treatment device
12 transfer chamber
15 roughing pump
16 load-lock chamber
20 exhaust pipe
21 horizontal pipe (communication pipe)
22 main pipe
24 on-off valve
28 third vacuum pump
30 atmospheric-air exhaust pipe
31 roughing pump
32 on-off valve
33 exhaust pipe
34 horizontal pipe (communication pipe)
35 second collecting pipe
36 exhaust pipe
37 horizontal pipe (communication pipe)
38 main pipe
39 branch pipe
40 on-off valve
42 on-off valve
43 on-off valve
47 inert-gas supply device
50 collecting pipe
51 exhaust pipe
53 on-off valve
61 upper wet-type abatement unit
62 catalytic-type abatement unit
63 lower wet-type abatement unit
70 evacuation unit
72 start-up pipe
73 shutoff valve
74 start-up pump
80 cleaning-gas exhaust pipe
81 cleaning-gas exhaust pump
84 exhaust pipe
85 horizontal pipe (communication pipe)
86 main pipe
87 branch pipe
91 on-off valve
92 on-off valve
101 combustion-type abatement unit
102 wet-type abatement unit
111 exhaust pipe
112 on-off valve
118 exhaust-gas treatment device
119 wet-type abatement unit
121, 122, 124 shutoff valve
130 abatement unit
145 suction pipe
146, 146A, 146B branch pipe
148 backup pipe
150, 150A, 150B vacuum pump
152 backup pump
155, 155A, 155B on-off valve
156 backup valve
160 operation controller,
161 pressure sensor
165 booster pump

The invention claimed is:

1. A vacuum evacuation system for evacuating a gas from a plurality of process chambers, comprising:
    a plurality of first vacuum pumps which can be coupled to the plurality of process chambers, respectively;
    a collecting pipe coupled to the plurality of first vacuum pumps;
    a second vacuum pump coupled to the collecting pipe, the plurality of first vacuum pumps and the second vacuum pump being disposed in a first room; and
    a third vacuum pump coupled to the second vacuum pump, the third vacuum pump being disposed in a second room which is separated from the first room.

2. The vacuum evacuation system according to claim 1, wherein the second vacuum pump is disposed near the plurality of first vacuum pumps.

3. The vacuum evacuation system according to claim 1, wherein:
    the collecting pipe comprises a plurality of collecting pipes, and the second vacuum pump comprises a plurality of second vacuum pumps;
    all of the plurality of collecting pipes are coupled to the plurality of first vacuum pumps; and
    the plurality of second vacuum pumps are coupled to the plurality of collecting pipes, respectively.

4. The vacuum evacuation system according to claim 3:
    wherein the third vacuum pump is coupled to the plurality of second vacuum pumps,
    wherein the plurality of second vacuum pumps comprise multi-stage positive-displacement vacuum pumps.

5. The vacuum evacuation system according to claim 3, further comprising:
    a second collecting pipe through which the plurality of second vacuum pumps are coupled to the third vacuum pump,
    wherein the plurality of collecting pipes comprise a plurality of first collecting pipes.

6. The vacuum evacuation system according to claim 5, wherein the third vacuum pump comprises a plurality of third vacuum pumps which are arranged in parallel.

7. The vacuum evacuation system according to claim 6, wherein the second collecting pipe has a plurality of branch pipes coupled to the plurality of third vacuum pumps, respectively, and a plurality of on-off valves are attached to the plurality of branch pipes, respectively.

8. The vacuum evacuation system according to claim 1, wherein:
    the collecting pipe comprises a first collecting pipe;
    the vacuum evacuation system includes a plurality of evacuation units and the third vacuum pump is disposed downstream of the second vacuum pump;
    the plurality of first vacuum pumps, the second vacuum pump, and the first collecting pipe constitute one of the plurality of evacuation units; and
    the vacuum evacuation system further comprises a second collecting pipe through which the plurality of second vacuum pumps, included in the plurality of evacuation units, are coupled to the third vacuum pump.

9. The vacuum evacuation system according to claim 4, wherein the third vacuum pump comprises a multi-stage positive-displacement vacuum pump.

* * * * *